US011956940B2

(12) United States Patent
Doornbos et al.

(10) Patent No.: US 11,956,940 B2
(45) Date of Patent: *Apr. 9, 2024

(54) VERTICAL HETEROSTRUCTURE SEMICONDUCTOR MEMORY CELL AND METHODS FOR MAKING THE SAME

(71) Applicant: Taiwan Semiconductor Manufacturing Company Limited, Hsinchu (TW)

(72) Inventors: Gerben Doornbos, Kessel-Lo (BE); Marcus Johannes Henricus Van Dal, Linden (BE)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/102,758

(22) Filed: Jan. 29, 2023

(65) Prior Publication Data

US 2023/0171937 A1 Jun. 1, 2023

Related U.S. Application Data

(63) Continuation of application No. 17/199,646, filed on Mar. 12, 2021, now Pat. No. 11,569,244.

(60) Provisional application No. 63/031,744, filed on May 29, 2020.

(51) Int. Cl.
*H10B 12/00* (2023.01)
*H01L 29/06* (2006.01)
*H01L 29/225* (2006.01)
*H01L 29/66* (2006.01)
*H01L 29/78* (2006.01)
*H01L 29/786* (2006.01)

(52) U.S. Cl.
CPC ....... *H10B 12/033* (2023.02); *H01L 29/0673* (2013.01); *H01L 29/225* (2013.01); *H01L 29/66742* (2013.01); *H01L 29/785* (2013.01); *H01L 29/78642* (2013.01); *H01L 29/7869* (2013.01); *H01L 29/78696* (2013.01); *H10B 12/03* (2023.02); *H10B 12/05* (2023.02); *H10B 12/30* (2023.02); *H10B 12/315* (2023.02); *H10B 12/395* (2023.02); *H10B 12/482* (2023.02); *H01L 2029/7858* (2013.01)

(58) Field of Classification Search
CPC ............. H01L 29/0673; H01L 29/0676; H01L 29/225; H01L 29/42392; H01L 29/66742; H01L 29/66795; H01L 29/785; H01L 29/78642; H01L 29/78696; H01L 2029/7858; H10B 12/03; H10B 12/033; H10B 12/05; H10B 12/30; H10B 12/315; H10B 12/36; H10B 12/395; H10B 12/482; B82Y 10/00
See application file for complete search history.

(56) References Cited

U.S. PATENT DOCUMENTS

2018/0061835 A1* 3/2018 Yang .................. H10B 12/00

* cited by examiner

*Primary Examiner* — Cheung Lee
(74) *Attorney, Agent, or Firm* — The Marbury Law Group, PLLC

(57) ABSTRACT

A memory cell comprises a nanowire structure comprising a channel region and source/drain regions of a transistor. The nanowire structure also comprises as first conductor of a capacitive device as a vertical extension of the nanowire structure.

20 Claims, 33 Drawing Sheets

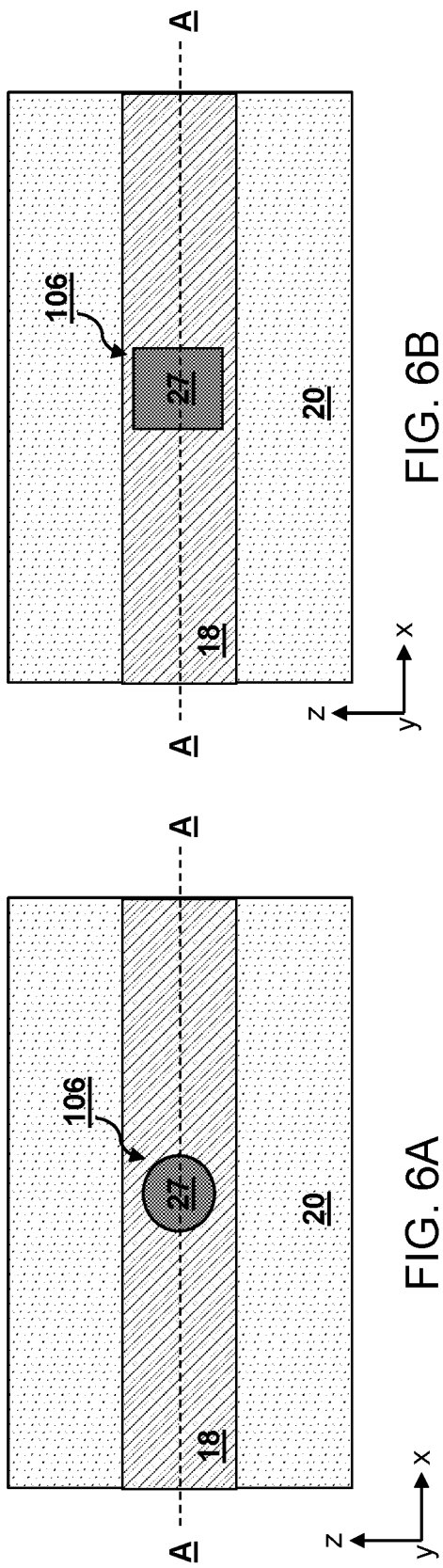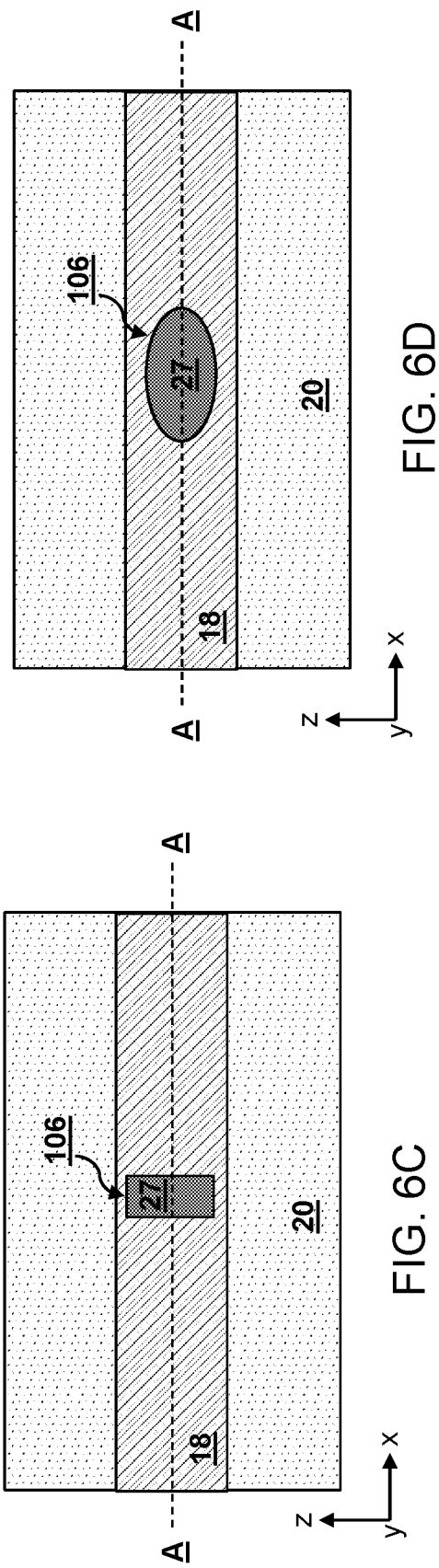

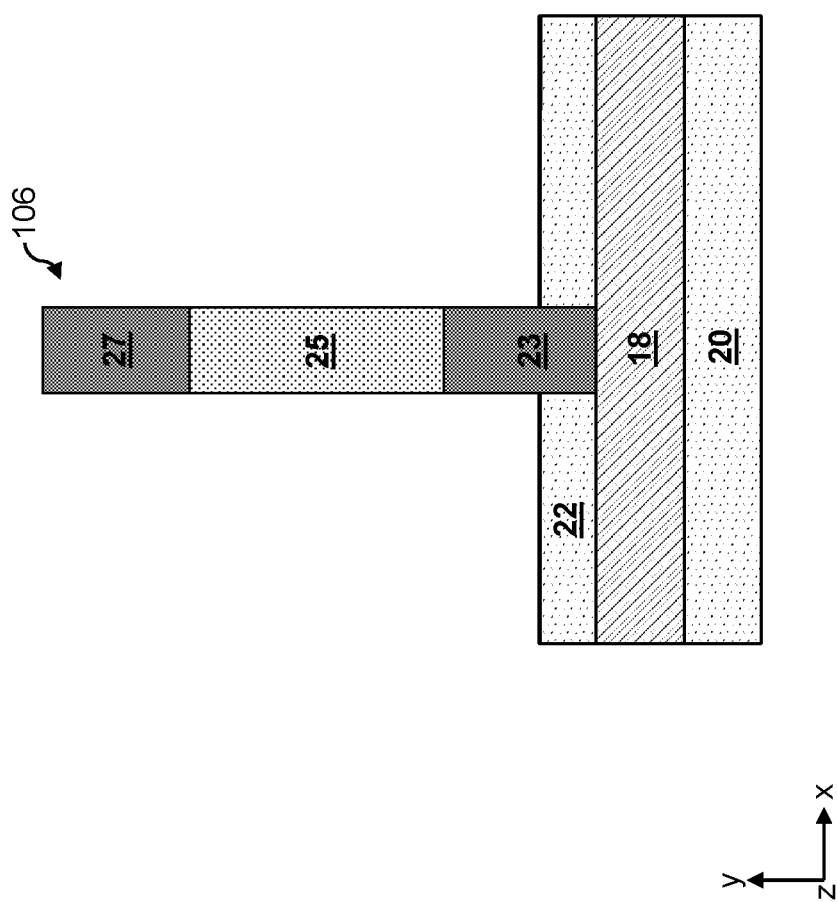

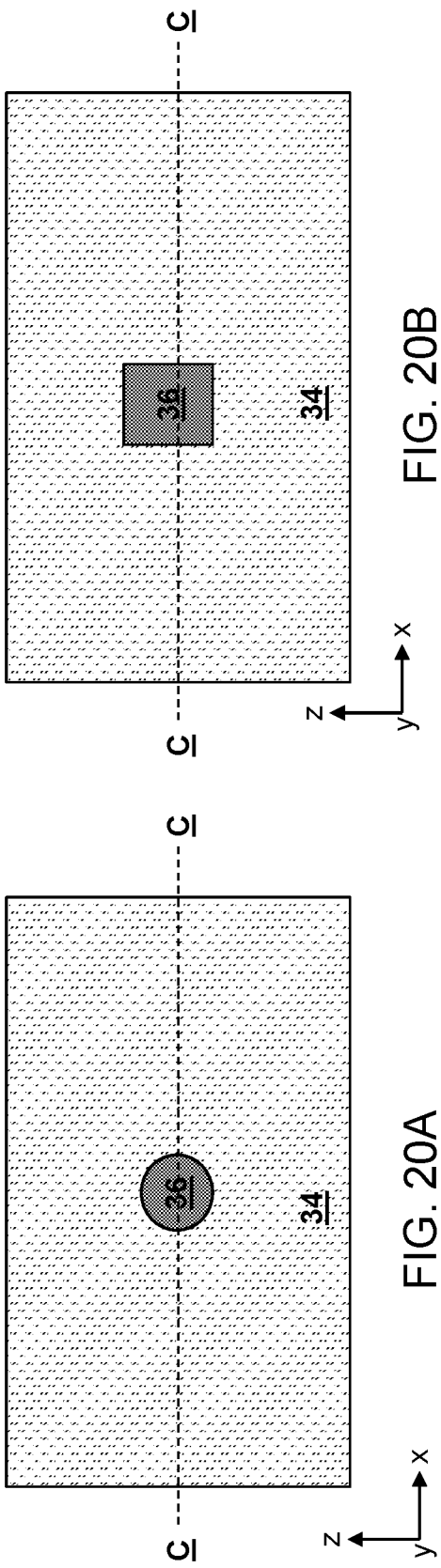
FIG. 20A
FIG. 20B
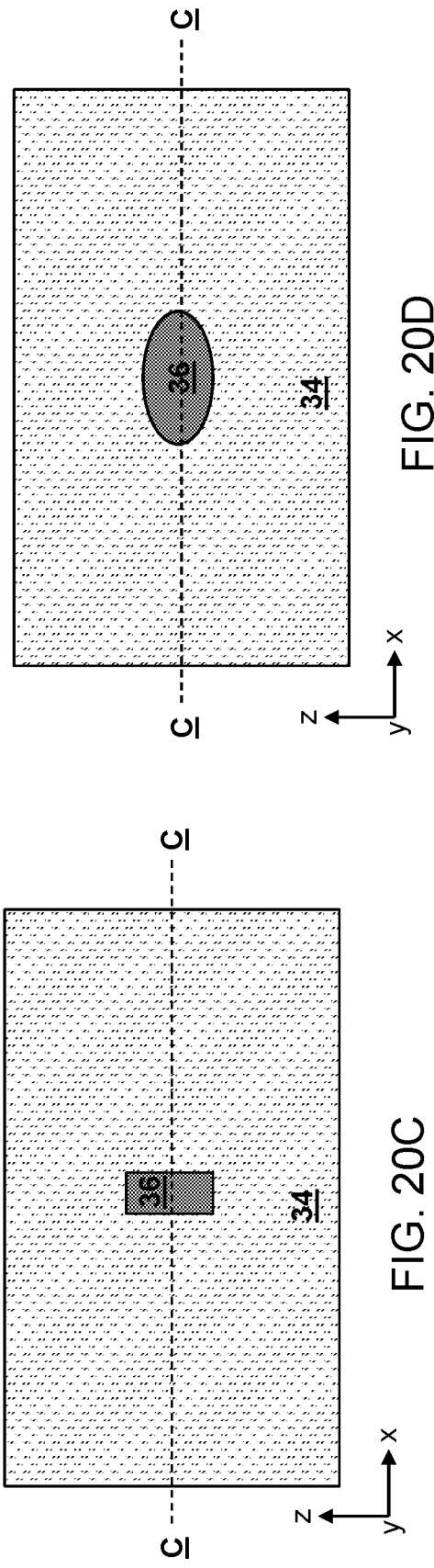
FIG. 20C
FIG. 20D

VERTICAL HETEROSTRUCTURE SEMICONDUCTOR MEMORY CELL AND METHODS FOR MAKING THE SAME

RELATED APPLICATIONS

This application is a continuation application of U.S. patent application Ser. No. 17/199,646, entitled "Vertical Heterostructure Semiconductor Memory Cell and Methods for Making the Same," filed on Mar. 12, 2021, which claims priority to U.S. Provisional Patent Application No. 63/031,744 entitled "Heterostructure Oxide Semiconductor Vertical Gate-All-Around (VGAA) Transistor" filed on May 29, 2020, the entire contents of both of which are hereby incorporated by reference for all purposes.

BACKGROUND

Advances in integrated circuit (IC) manufacturing, and specifically semiconductor device manufacturing, are making many different types of memory devices available for use in logic chip designs. For example, memory devices may include dynamic random access memory (DRAM) devices that include a capacitor to store charge and an access transistor. Generally, in current semiconductor manufacturing, a DRAM cell may include a planar field-effect-transistor (FET) and a metal-insulator-metal capacitor (MIMCAP). Due to the physical structure of each, the FET and MIMCAP for a DRAM cell are typically formed horizontally next to each other.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6D are top-down views of the exemplary structure of FIG. 5 showing different shapes of the channel structure suitable for use in various embodiments. The vertical plane A-A is the plane of the vertical cross-section of FIG. 5.

FIG. 7 is a vertical cross-sectional view of the exemplary structure after formation of a spacer oxide layer.

FIGS. 20A-20D are top-down views of the exemplary structure of FIG. 19 showing different shapes of a nanowire cavity for use in various embodiments. The vertical plane C-C is the plane of the vertical cross-section of FIG. 19.

DETAILED DESCRIPTION

Figure 1:
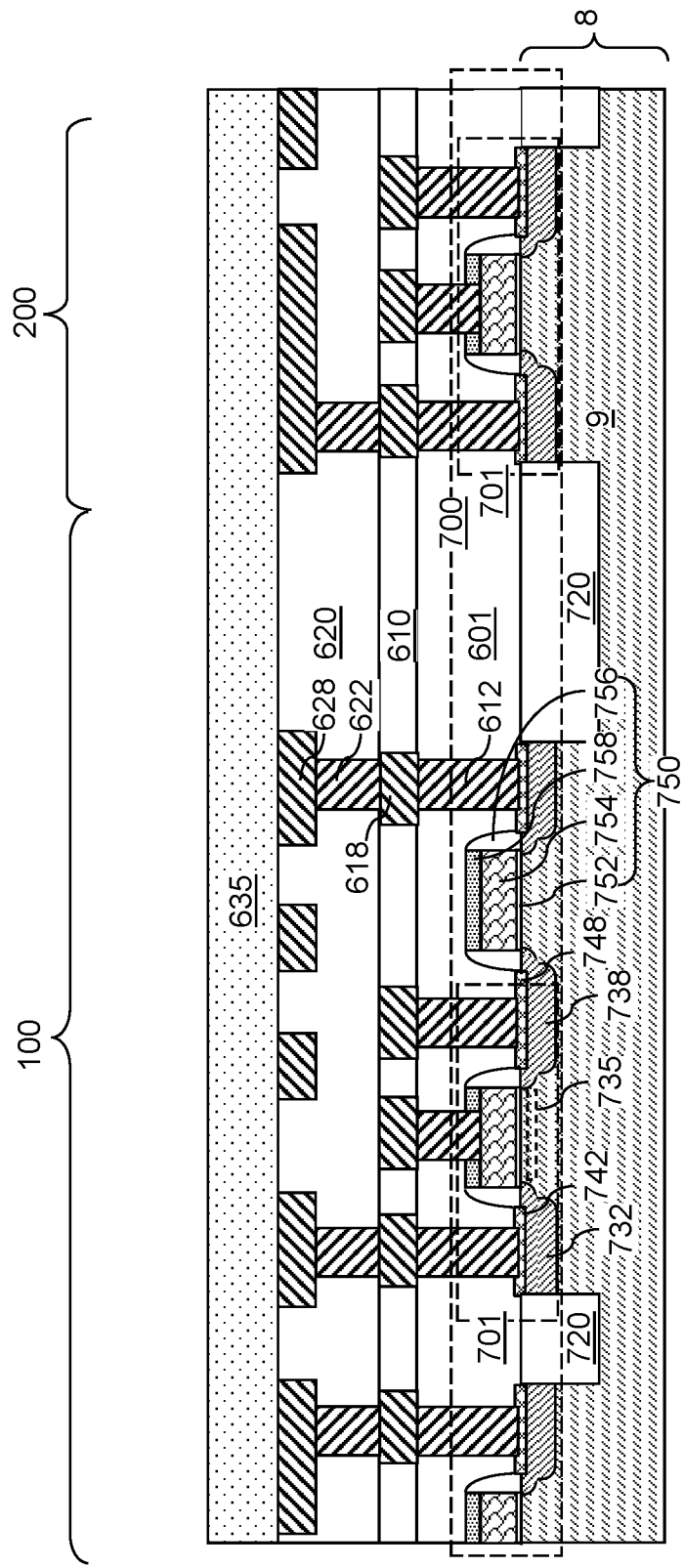
FIG. 1 is a vertical cross-sectional view of an exemplary structure after formation of complementary metal-oxide-semiconductor (CMOS) transistors, first metal interconnect structures formed in lower-level dielectric material layers, and an isolation dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first element, component, and/or feature over or on a second element, component, and/or feature in the description that follows may include embodiments in which the first and second elements, components, and/or feature are formed in direct contact, and may also include embodiments in which additional elements, components, and/or feature are formed between the first and second features, such that the first and second elements, components, and/or feature are not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element's, component's, and/or feature's relationship to another element(s), component(s), and/or feature(s) as illustrated in the Figures. The spatially relative terms are intended to encompass different orientations of the device in use or operation in addition to the orientation depicted in the Figures. The apparatus and/or device may be otherwise oriented (rotated 90 degrees or at other orientations) and the spatially relative descriptors used herein may likewise be interpreted accordingly. Unless explicitly stated otherwise, each element, component, and/or feature having the same reference numeral is presumed to have the same material composition and to have a thickness within a same thickness range.

Semiconductor device manufacturing generally may be categorized into front-end-of-the line (FEOL), middle-of-the-line (MOL), and back-end-of-the-line (BEOL) processes. Generally, in current semiconductor manufacturing, certain elements, such as access (or selector) transistors and capacitors, are formed in the FEOL processes. Some memory devices, such as DRAM devices, may be created by building a memory array (e.g., capacitors) in the BEOL processes. Such memory devices built in the BEOL processes often require an access (or selector) transistor to enable selection of a cell in the memory array for reading/writing (e.g., storing a charge in a capacitor). However, access (or selector) transistors are generally formed in the FEOL processes in current semiconductor manufacturing, and the access (or selector) transistors may not be ideal for memory devices created by building a memory array in BEOL processes. That is, for a memory cell, the access (or selector) transistor formed in the FEOL process is typically silicon (Si) FETs, and the capacitor need to be physically large, e.g., a metal-insulator-metal capacitor (MIMCAP). Due to the physical size of the capacitor, the Si FET and the MIMCAP are generally formed horizontally and are planar (e.g., current flows in-plane). As such, the access (or selector) transistor (e.g., FET) and the capacitor (e.g., MIMCAP) may not be stacked vertically in order to increase density or to embed logic. Any size savings that may be achieved by forming a vertical memory device may be diminished by the need to form the access (or selector) transistor in a horizontal manner.

Additionally, data stored in a volatile memory cell (e.g., a memory cell in a DRAM) needs to be "refreshed," e.g., read and rewritten, in order to preserve the data. A refresh rate $R_{ref}$ of a memory cell (e.g., a memory cell in a DRAM) depends on a retention time, $t_{ret}$, of the capacitor: $t_{ret}=Q/I_{off}$, where Q is the stored charge and $I_{off}$ is the off-current of the access (or selector) transistor. Typically, silicon transistors have a large off current, $I_{off}$, which requires a high stored charge, Q, in order to achieve a large retention time, $t_{ret}$. Oxide semiconductors, such as indium gallium zinc oxide thin-film transistors (InGaZnO TFTs) have a low off-current $I_{off}$, for example, below 1.0 picoAmpere (pA). Thus, oxide semiconductors transistors may be well suited for use in such memory devices.

According to embodiments of the present disclosure, a semiconductor device, e.g., a memory cell, includes a transistor, e.g., TFT, and memory element, e.g., capacitor that may be vertically stacked upon one another. Since the transistor and memory element may be vertically stacked, the overall horizontal area of the memory cell is reduced. Moreover, the vertically stacked transistors and memory element allows the various components of the memory cell to be formed during BEOL processes and may provide for additional room on the substrate.

In various embodiments disclosed herein, the transistor, e.g., TFT, may include a channel structure arranged in a first direction (e.g., vertical direction) with a gate structure surrounding the channel structure. In various embodiments disclosed herein, the channel structure may include a stacked nanowire structure, such as a stacked Indium-Gallium-Zinc-Oxide (IGZO)/Indium-Tin-Oxide (ITO) nanowire structure or other suitable vertically stacked material nanowire structure, vertically stacked up along the first direction (e.g., vertical direction). In various embodiments disclosed herein, a source and drain of the transistor may be formed of a first material, such as ITO or any other suitable material, and a channel may be formed of a second material, such as IGZO or any other suitable material. In some embodiments, the source, drain, and channel may all be formed from the same material, such as IGZO, or any other suitable material.

In various embodiments disclosed herein, the memory element, e.g., capacitor, may be stacked in the first direction on the transistor. In various embodiments disclosed herein, a first conductor of the capacitor may be formed as a vertical extension of the nanowire structure of the transistor. In various embodiments disclosed herein, the first conductor of the capacitor may be configured in the first direction (e.g., vertical direction) with a dielectric material surrounding the first conductor and a second conductor surrounding the dielectric material. In various embodiments disclosed herein, the first conductor of the capacitor may be formed of the same material, such as ITO, as the source and drain of the transistor. In various embodiments disclosed herein, the first conductor plate of the capacitor may be formed of one or more materials that differ from the source and drain of the transistor, e.g., metal or metal alloy. In any of the embodiments, the memory cell (e.g., the transistor and memory element) of the various embodiments may be fabricated in a BEOL processes.

Referring to FIG. 1, an exemplary structure according to an embodiment of the present disclosure is illustrated. The exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source region 732, a drain region 738, a semiconductor channel 735 that includes a surface portion of the substrate 8 extending between the source region 732 and the drain region 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738.

The exemplary structure may include a memory array region 100 in which an array of memory cells may be subsequently formed. The exemplary structure may further include a peripheral region 200 in which control circuitry for the array of memory devices is provided. Generally, the field effect transistors 701 in the CMOS circuitry 700 may be electrically connected to an electrode of a respective memory cell by a respective set of metal interconnect structures.

Devices (such as field effect transistors 701) in the peripheral region 200 may provide functions that operate the array of memory cells to be subsequently formed. Specifically, devices in the peripheral region may be configured to control the programming operation, the erase operation, and the sensing (read) operation of the array of memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective memory cell to be subsequently formed. For example, a plurality of field effect transistors 701 in the CMOS circuitry 700 may include a respective source region 732 or a respective drain region 738 that is subsequently electrically connected to a node of a respective memory cell to be subsequently formed.

In one embodiment, the CMOS circuitry 700 may include a programming control circuit configured to control gate voltages of a set of field effect transistors 701 that are used for programming a respective memory cell and to control gate voltages of access (or selector) transistors to be subsequently formed.

Various metal interconnect structures formed within dielectric material layers may be subsequently formed over the substrate 8 and the semiconductor devices thereupon (such as field effect transistors 701). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, and a second interconnect-level dielectric material layer 620. The metal interconnect structures may include device contact via structures 612 formed in the first dielectric material layer 601 and contact a respective component of the CMOS circuitry 700, first metal line structures 618 formed in the first interconnect-level dielectric material layer 610, first metal via structures 622 formed in a lower portion of the second interconnect-level dielectric material layer 620, and second metal line structures 628 formed in an upper portion of the second interconnect-level dielectric material layer 620.

Each of the dielectric material layers (601, 610, 620) may include a dielectric material such as silicon dioxide, undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner (such as a metallic nitride or a metallic carbide) and a metallic fill material. Each metallic liner may include Titanium Nitride (TiN), Tantalum Nitride (TaN), Tungsten Nitride (WN), Titanium Carbide (TiC), Tantalum Carbide (TaC), and Tungsten Carbide (WC), and each metallic fill material portion may include Tungsten (W), Copper (Cu), Aluminum (Al), Cobalt (Co), Ruthenium (Ru), Molybdenum (Mo), Tantalum (Ta), Titanium (Ti), alloys thereof, and/or combinations thereof. Other suitable materials within the contemplated scope of disclosure may also be used. In one embodiment, the first metal via structures 622 and the second metal line structures 628 may be formed as integrated line and via structures by a dual damascene process. While the present disclosure is described using an embodiment in which an array of memory cells formed over the second line-and-via-level dielectric material layer 620, embodiments are expressly contemplated herein in which the array of memory cells may be formed at a different metal interconnect level.

An array of access (or selector) transistors and an array of memory cells may be subsequently deposited over the dielectric material layers (601, 610, 620) that have formed therein the metal interconnect structures (612, 618, 622, 628). The set of all dielectric material layers that are formed prior to formation of an array of access (or selector) transistors or an array of memory cells is collectively referred to as lower-level dielectric material layers (601, 610, 620). The set of all metal interconnect structures that is formed within the lower-level dielectric material layers (601, 610, 620) is herein referred to as first metal interconnect structures (612, 618, 622, 628). Generally, first metal interconnect structures (612, 618, 622, 628) formed within at least one lower-level dielectric material layer (601, 610, 620) may be formed over the semiconductor material layer 9 that is located in the substrate 8.

According to an aspect of the present disclosure, access (or selector) transistors may be formed in a metal interconnect level that overlies that metal interconnect levels that contain the lower-level dielectric material layers (601, 610, 620) and the first metal interconnect structures (612, 618, 622, 628). In one embodiment, a planar dielectric material layer having a uniform thickness may be formed over the lower-level dielectric material layers (601, 610, 620). The planar dielectric material layer is herein referred to as a planar insulating spacer layer 635. The planar insulating spacer layer 635 includes a dielectric material such as undoped silicate glass, a doped silicate glass, organosilicate glass, or a porous dielectric material, and may be deposited by chemical vapor deposition. The thickness of the planar insulating spacer layer 635 may be in a range from 30 nm to 300 nm, although lesser and greater thicknesses may also be used.

Generally, interconnect-level dielectric layers (such as the lower-level dielectric material layer (601, 610, 620)) containing therein the metal interconnect structures (such as the first metal interconnect structures (612, 618, 622, 628)) may be formed over CMOS circuitry 700. The planar insulating spacer layer 635 may be formed over the interconnect-level dielectric layers.

Various embodiments of the present disclosure may provide a hetero-structure vertical nanowire transistor memory cell, such as a capacitor memory element stacked over a thin-film transistor (TFT) that may operate as an access (or selector) transistor in which a source and a drain may be a first material, such as ITO or any other suitable material, and the channel may be a second material, such as IGZO or any other suitable material. Various embodiments of the present disclosure may provide a hetero-structure vertical nanowire transistor, where source, drain, and channel may all be the same material, such as ITO, IGZO, or any other suitable material. The hetero-structure vertical nanowire transistor of the various embodiments may be fabricated in a BEOL process.

The hetero-structure vertical nanowire transistor device of the various embodiments of the present disclosure may include a memory element and a transistor connected in series and stacked up along a first direction. The transistor may include a channel structure including a channel region and source/drain regions located on two sides of the channel region. The channel region and the source/drain regions may be stacked up along the first direction. The transistor may include a gate structure surrounding the channel structure. The transistor may include a first contact structure disposed on a bottom surface of the channel structure and connected to one of the source/drain regions. The transistor may include a second contact structure disposed on a top surface of the channel structure and connected to one of the source/drain regions. The gate structure may be located in between the first contact structure and the second contact structure.

Figure 2:
FIG. 2 is a vertical cross-sectional view of the exemplary structure after formation of an interlayer dielectric (ILD) layer.

FIG. 2 is a vertical cross-sectional view of the exemplary structure after formation of an interlayer dielectric (ILD) layer 20. The ILD layer 20 may be formed from an ILD material such as silicon dioxide, undoped silicate glass, a doped silicate glass, organosilicate glass, or a porous dielectric material. Other suitable materials for use as the ILD layer 20 are within the contemplated scope of the disclosure. The ILD layer 20 may be formed by any deposition process, such as chemical vapor deposition, spin-coating, physical vapor deposition (PVD) (also referred to as sputtering), atomic layer deposition (ALD), etc. The ILD layer 20 may be a layer separating FEOL devices and BEOL devices such as insulating spacer layer 635 as illustrated in FIG. 1. Thus, the hetero-structure vertical nanowire transistor formed over the ILD layer 20 may also be formed over the structure shown in FIG. 1 in which the planar insulating spacer layer 635 serves as ILD layer 20. While not illustrated, the ILD layer 20 may include other features such as vias, contacts, metal tracks in order to connect semiconductor devices on either side of the ILD layer 20. The ILD layer 20 may be formed as part of a BEOL process. As examples, as the ILD layer 20 may be formed as part of a BEOL process, the ILD layer 20 may be located in an interconnect, above a complementary metal-oxide-semiconductor (CMOS) transistor, below a CMOS transistor, etc.

Figure 3:
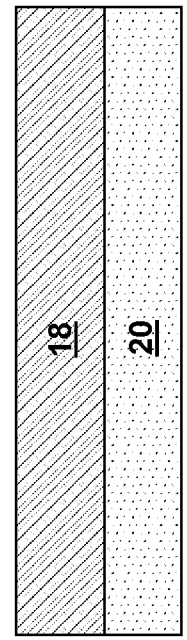
FIG. 3 is a vertical cross-sectional view of the exemplary structure after formation of a bit line layer over the ILD layer.

FIG. 3 is a vertical cross-sectional view of the exemplary structure after formation of a bit line 18 over the ILD layer 20. The bit line 18 may be formed on top of the ILD layer 20 in a direction, such as the y-direction illustrated in FIG. 3. In this manner the bit line 18 may be stacked up along the y-direction with the ILD layer 20. The bit line 18 may be formed from Cu, Co, Ru, W, Ti, Ta, TiN, TaN, or combinations thereof. Other suitable materials for use as the bit line 18 are within the contemplated scope of the disclosure. The bit line 18 may be formed by a conformal or non-conformal deposition process, such as PVD, ALD, etc. The thickness of the bit line 18 may be in a range from approximately 2 nm to approximately 40 nm, such as from approximately 4 nm to approximately 20 nm, although lesser and greater thicknesses may also be used. The bit line 18 may operate to "read" or "write" data to a subsequently formed capacitive device 104, e.g., extract a charge from the capacitive device 104 or store a charge in the capacitive device 104.

Figure 4:
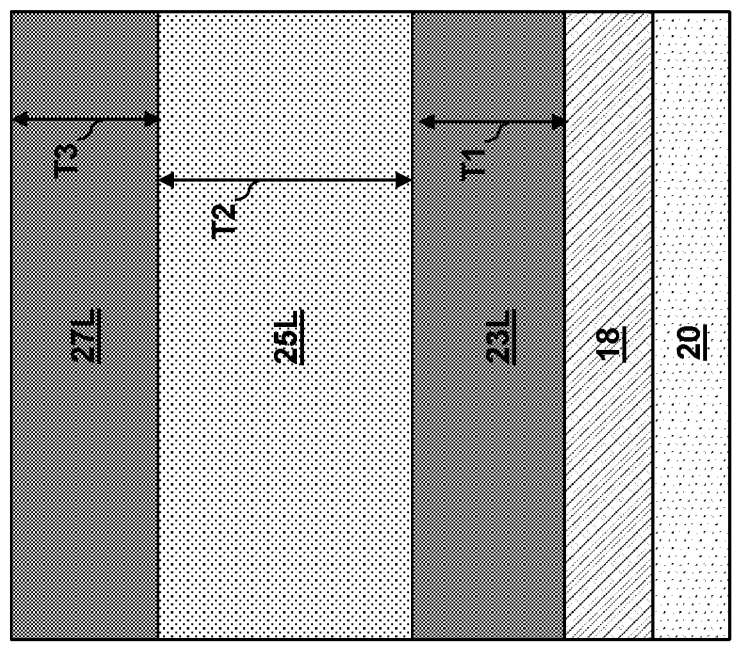
FIG. 4 is a vertical cross-sectional view of the exemplary structure after formation of semiconductor layers over the bit line layer.

FIG. 4 is a vertical cross-sectional view of the exemplary structure after formation of semiconductor layers 23L, 25L, 27L over the bit line 18. The semiconductor layers 23L, 25L, 27L may comprise an oxide semiconductor layer stack. The semiconductor layers 23L, 25L, 27L may be formed in three layers stacked up in the y-direction as illustrated in FIG. 4, such that one layer of the semiconductor layer 23L may be a bottom layer deposited on the bit line 18, a second layer of the semiconductor layer 25L may be a middle layer deposited on the bottom layer of the semiconductor layer 23L, and the third layer of the semiconductor layer 27L may be a top layer deposited on the middle layer of the semiconductor layer 25L. The second layer of the semiconductor layer 25L may separate the bottom layer of the semiconductor 23L from the top layer of the semiconductor layer 27L. The semiconductor layers 23L, 25L, 27L may be deposited sequentially on top of one another in the y-direction such that the semiconductor layer 23L may be deposited first, the semiconductor layer 25L may be deposited second, and the semiconductor layer 27L may be deposited third. The semiconductor layers 23L, 25L, 27L may be formed by a conformal or non-conformal deposition process, such as PVD, ALD, etc. The semiconductor layers 23L, 25L, 27L may be formed from Indium Gallium Zinc Oxide (IGZO), Indium Tin Oxide (ITO), Gallium Oxide (e.g., $Ga_2O_3$), or Indium Oxide (e.g., $In_2O_3$), Zinc Oxide (e.g., ZnO). Other suitable materials for use as the semiconductor layers 23L, 25L, 27L are within the contemplated scope of the disclosure.

The semiconductor layers 23L, 25L, 27L may be deposited in respective thicknesses T1, T2, and T3. In some embodiments, thickness T1 semiconductor layer 23L and thickness T3 semiconductor layer 27L may be the same. In some embodiments, thickness T1 semiconductor layer 23L and thickness T3 semiconductor layer 27L may be different. In some embodiments, the thickness T2 of the semiconductor layer 25L may be greater than the thickness T1 of the semiconductor layer 23L and the thickness T2 of the semiconductor layer 25L may be greater than the thickness T3 of the semiconductor layer 27L. The thickness T1 of the semiconductor layer 23L may be in a range from approximately 5 nm to approximately 80 nm, such as from approximately 10 nm to approximately 40 nm, although lesser and greater thicknesses may also be used. The thickness T2 of the semiconductor layer 25L may be in a range from approximately 10 nm to approximately 80 nm, such as from approximately 20 nm to approximately 40 nm, although lesser and greater thicknesses may also be used. The thickness T3 of the semiconductor layer 27L may be in a range from approximately 5 nm to approximately 80 nm, such as from approximately 10 nm to approximately 40 nm, although lesser and greater thicknesses may also be used.

As one specific example of the compositions of the semiconductor layers 23L, 25L, 27L, the semiconductor layer 23L may be formed from ITO, the semiconductor layer 25L may be formed from IGZO, and the semiconductor layer 27L may be formed from ITO. As further specific examples of the compositions of the semiconductor layers 23L, 25L, 27L, the layers of the semiconductor layer 23L and 27L may be formed from a semiconducting oxide that makes good contact to a metal, such as ITO, InZnO, or oxygen deficient (e.g., highly doped) IGZO, and the semiconductor layer 25L may be formed from a material that makes a good low-leakage transistor, such as stoichiometric InGaZnO$_4$, Ga$_2$O$_3$, In$_2$O$_3$, or ZnO. As another specific example, of the compositions of the semiconductor layers 23L, 25L, 27L, each of the semiconductor layers 23L, 25L, 27L may be formed from IGZO where the composition in all three layers 23L, 25L, 27L is different. As another specific example, of the compositions of the semiconductor layers 23L, 25L, 27L, each of the semiconductor layers 23L, 25L, 27L may be formed from IGZO where the composition in the semiconductor layers 23L, 27L is different than the composition in the semiconductor layer 25L.

Figure 5:
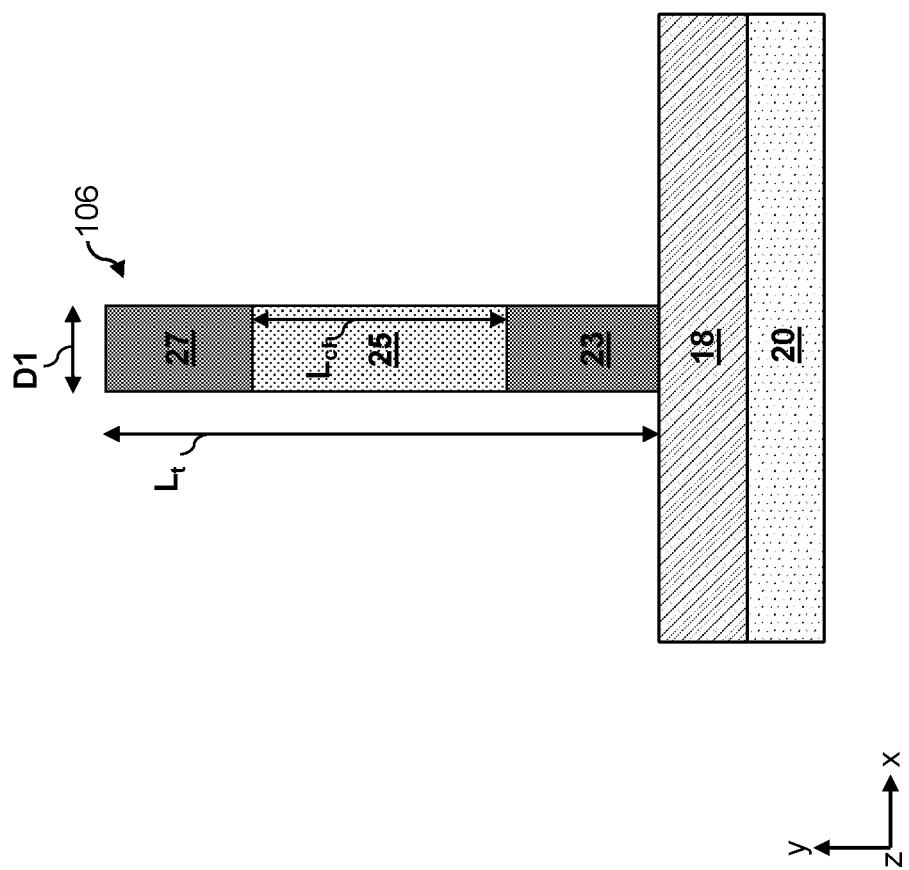
FIG. 5 is a vertical cross-sectional view of the exemplary structure after formation of a channel structure.

FIG. 5 is a vertical cross-sectional view of the exemplary structure after formation of a nanowire structure 106. The nanowire structure 106 may be formed by patterning or otherwise removing portions of the semiconductor layer stack formed from the semiconductor layers 23L, 25L, 27L to form a vertical structure in the y-direction. The patterning or removal of the material of the semiconductor layers 23L, 25L, 27L may be performed in any suitable manner, such as via a masking and etching process, etc. The nanowire structure 106 may be a pillar extending in the stacked-up direction (e.g., a vertical pillar extending in the y-direction). The nanowire structure 106 may be formed from the semiconductor layers 23L, 25L, 27L such that the nanowire structure 106 includes two drain/source regions 23, 27 located on respective sides of a channel region 25. The channel region 25 and the two drain/source regions 23, 27 may be stacked up along the same direction, such as the y-direction. The channel region 25 may be formed from the semiconductor layer 25L and the two drain/source regions 23, 27 may be formed from the semiconductor layers 23L and 27L, respectively.

The nanowire structure 106 may be a nanowire extending in the y-direction. In some embodiments, the nanowire structure 106 may be a pillar that is a cylindrical structure extending in the stacked-up direction. For example, FIG. 6A is a top-down view of the exemplary structure of FIG. 5 showing the nanowire structure 106 as a cylindrical nanowire having a circular cross-section. The vertical plane A-A is the plane of the vertical cross-section of FIG. 5. Additionally, the channel region 25 may be a pillar with other cross-sections that are not circular. In some embodiments, the nanowire structure 106 may be a pillar that is a cuboid structure extending in the stacked-up direction. For example, FIG. 6B is a top-down view of the exemplary structure of FIG. 5 showing the nanowire structure 106 as a cuboid nanowire having a square cross-section. The vertical plane A-A is the plane of the vertical cross-section of FIG. 5. The corners of the square cross-section may or may not be rounded. As another example, FIG. 6C is a top-down view of the exemplary structure of FIG. 5 showing the nanowire structure 106 as a cuboid nanowire having a rectangular cross-section. The vertical plane A-A is the plane of the vertical cross-section of FIG. 5. The corners of the rectangular cross-section may or may not be rounded. In some embodiments, the nanowire structure 106 may be a pillar that is an oval-cross section structure extending in the stacked-up direction. For example, FIG. 6D is a top-down view of the exemplary structure of FIG. 5 showing the nanowire structure 106 as a nanowire having an oval cross-section. The vertical plane A-A is the plane of the vertical cross-section of FIG. 5. Other cross-sectional shapes are within the contemplated scope of the disclosure. For example, triangular or polygonal cross sections may be within the contemplated scope of disclosure.

Referring back to FIG. 5, the length $L_{ch}$ of the channel region 25 in the stacked-up direction (e.g., the y-direction) may be the same as the thickness T2 of the semiconductor layer 25L. The length $L_{ch}$ may be in a range from approximately 10 nm to approximately 80 nm, such as from approximately 20 nm to approximately 40 nm, although lesser and greater thicknesses may also be used. The length ($L_t$) of the nanowire structure 106 in the stacked-up direction (e.g., the y-direction) may correspond to the total length of the two drain/source regions 23, 27 and the channel region 25. The diameter D1 of the nanowire structure 106 may be nominally uniform along the entire height of the nanowire structure 106. Said another way, the diameter D1 may be uniform along the stacked-up direction (e.g., the y-direction). The channel length $L_{ch}$ may be approximately three times (3×) the diameter D1.

While FIG. 5 illustrates a diameter D1, which may correspond to a circular cross section of the nanowire structure 106, the dimensions of the nanowire structure 106 can be derived in a plane of the x-direction and z-direction that may be defined relative to the cross-sectional shape. For example, if the nanowire structure 106 has a rectangular or square cross-section, as illustrated in FIG. 6B or 6C, the nanowire structure 106 may be defined by a width and length. Likewise, if the nanowire structure 106 has an oval or elliptical cross-section, as illustrated in FIG. 6D, the nanowire structure 106 may be defined by a length of a major axis, a length of a minor axis, a distance between a center of the ellipse and each focus. In any of these examples, the channel length $L_{ch}$ may be approximately three times (3C×) any of these dimensions, e.g., width of a rectangle/square, length of a rectangle/square, length of major axis of an ellipse, length of minor axis of an ellipse, or distance between focus of an ellipse.

FIG. 7 is a vertical cross-sectional view of the exemplary structure after formation of a spacer oxide layer 22. The spacer oxide layer 22 may be formed on top of the bit line 18 in a direction, such as the y-direction illustrated in FIG. 7. In this manner the spacer oxide layer 22 may be stacked up along the y-direction on top of the bit line 18 and alongside/with the nanowire structure 106. The spacer oxide layer 22 may be formed from Silicon dioxide (SiO$_2$). Other suitable materials for use as the spacer oxide layer 22 are within the contemplated scope of the disclosure. The spacer oxide layer 22 may be formed by a conformal or non-conformal deposition process, such as PVD, ALD, etc.

The thickness of the spacer oxide layer 22 may be in a range from approximately 2 nm to approximately 20 nm, such as from approximately 5 nm to approximately 10 nm, although lesser and greater thicknesses may also be used. The spacer oxide layer 22 may be formed on the bit line 18 and to surround a portion of drain region 23 of the nanowire structure 106. The spacer oxide layer 22 may be configured to act as an isolation layer to isolate the bit line 18 from additional layers that will be built up on top of the spacer oxide layer 22.

Figure 8:
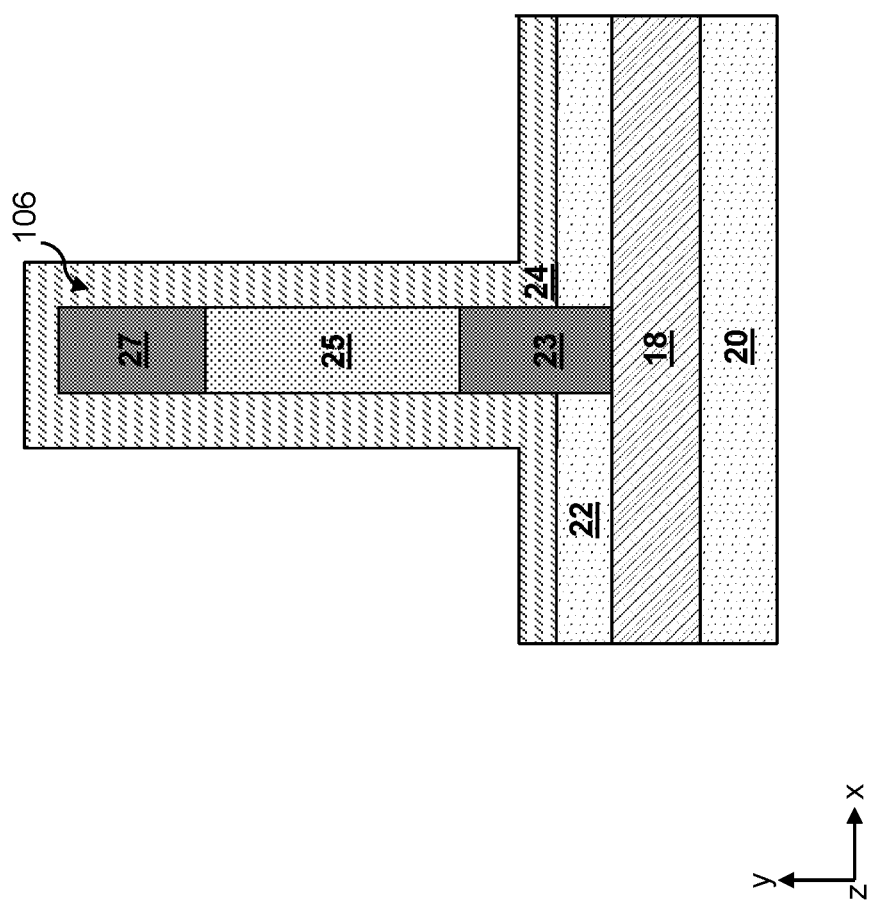
FIG. 8 is a vertical cross-sectional view of the exemplary structure after formation of a first dielectric layer.

FIG. 8 is a vertical cross-sectional view of the exemplary structure after formation of a first dielectric layer 24. The first dielectric layer 24 may be formed on top of the nanowire structure 106 and spacer oxide layer 22 in a direction, such as the y-direction illustrated in FIG. 8. In this manner the first dielectric layer 24 may be stacked up along the y-direction on top of the spacer oxide layer 22. The first dielectric layer 24 may surround the nanowire structure 106 including portions of the drain region 23, the channel region 25, and the source region 27 of the nanowire structure 106. The first dielectric layer 24 may be formed from a high dielectric constant (high-k) dielectric material, such as Hafnium dioxide (e.g., $HfO_2$), Aluminum Oxide (e.g., $Al_2O_3$), Hafnium Zirconium oxide (HZO), species of Hafnium Silicon Oxide (e.g., $HfSiO_x$), species of Hafnium Lanthanum Oxide (e.g., $HfLaO_x$), etc. Other suitable materials for use as the first dielectric layer 24 are within the contemplated scope of the disclosure. The first dielectric layer 24 may be formed by a conformal deposition process, such as ALD. The thickness of the first dielectric layer 24 may be in a range from to approximately 1 nm to approximately 16 nm, such as from to approximately 2 nm to approximately 8 nm, although lesser and greater thicknesses may also be used.

Figure 9:
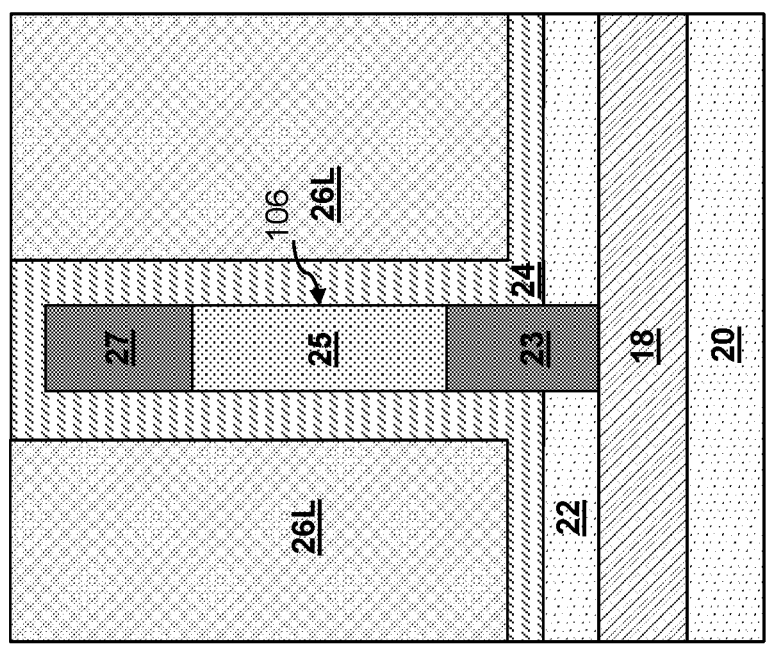
FIG. 9 is a vertical cross-sectional view of the exemplary structure after formation of a gate layer.

FIG. 9 is a vertical cross-sectional view of the exemplary structure after formation of a gate layer 26L. The gate layer 26L may be formed on top of the first dielectric layer 24 in a direction, such as the y-direction illustrated in FIG. 8. In this manner the gate layer 26L may be stacked up along the y-direction on top of the first dielectric layer 24 and surrounding the nanowire structure 106. In this manner, the first dielectric layer 24 may be between the nanowire structure 106 and the gate layer 26L and the dielectric layer 24 may be between the gate layer 26L and the spacer oxide layer 22. The gate layer 26L may be formed from a metal material, such as TiN, TaN, Ti, Ta, W, Titanium Aluminum (TiAl), etc. Other suitable materials for use as the gate layer 26L are within the contemplated scope of the disclosure. The gate layer 26L may be formed by a conformal or non-conformal deposition process, such as PVD, ALD, etc. The gate layer 26L may be etched to form a gate structure 26 that operates to control the output current of a subsequently formed transistor 105. The gate structure 26 may be or form part of a word line 40, as illustrated in FIGS. 16A-17B discussed below. In some embodiments, portions of the gate layer 26L may be removed and replaced with a word line 40 material. The gate structure 26 and word line 40 may operate to activate the transistor 105 so that the bit line 18 may "read" or "write" data to the capacitive device 104, e.g., extract a charge from the capacitive device 104 or store a charge in the capacitive device 104.

Figure 10:
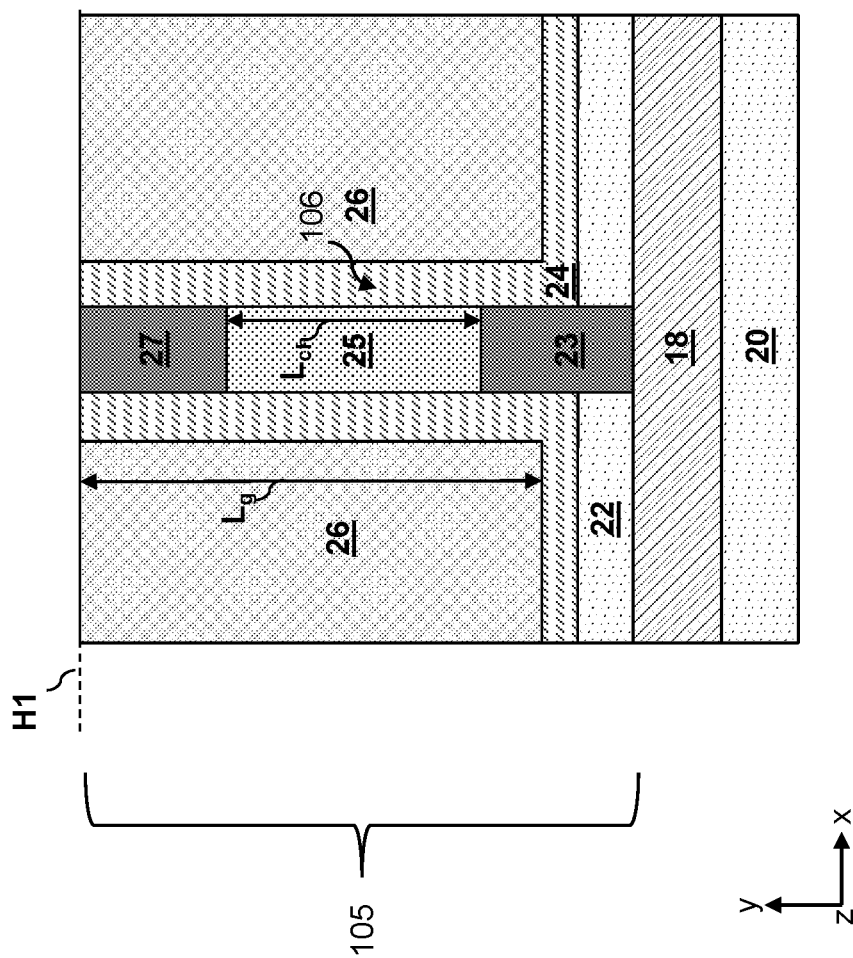
FIG. 10 is a vertical cross-sectional view of the exemplary structure after removal of gate material and dielectric material.

FIG. 10 is a vertical cross-sectional view of the exemplary structure after removal of a portion gate layer 26L and a portion of the first dielectric layer 24. FIG. 10 illustrates that material from both the gate layer 26L and first dielectric layer 24 may be removed, such as by chemical-mechanical polishing (CMP) processes to render the gate layer 26L and first dielectric layer 24 co-planar with a height H1 extending orthogonally from the stacked-up direction (e.g., in the y-direction). After removal of the gate material from the gate layer 26L, the gate structure 26 may have a length $L_g$ in the stacked-up direction (e.g., a length $L_g$ in the y-direction) that is greater than the length $L_{ch}$ of the channel region 25 in the stacked-up direction (e.g., the length $L_{ch}$ in the y-direction). The length $L_g$ of the gate structure 26 in the stacked-up direction (e.g., the length $L_g$ in the y-direction) of the gate structure 26 may range from approximately 20 nm to approximately 160 nm, such as from approximately 40 nm to approximately 80 nm, although lesser and greater lengths may also be used. The drain/source regions 23, 27, channel region 25, first dielectric layer 24, and gate structure 26 may form a transistor 105 in a nanowire structure 106.

Figure 11:
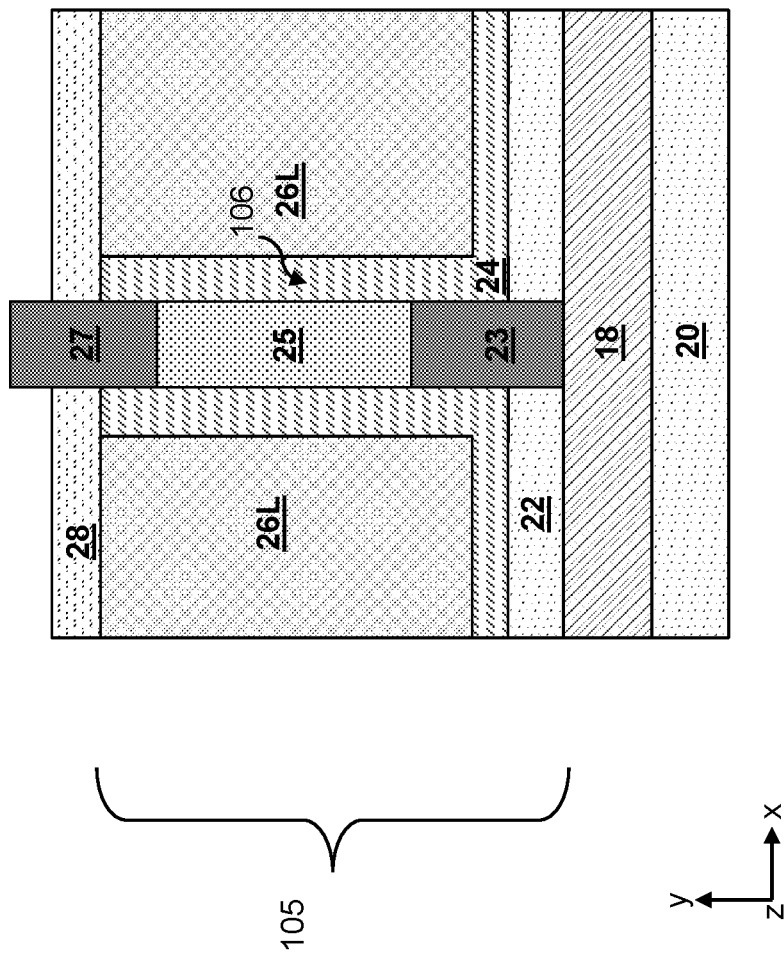
FIG. 11 is a vertical cross-sectional view of the exemplary structure after gate structure formation.

FIG. 11 is a vertical cross-sectional view of the exemplary structure after a second spacer 28 formation. Based on the structure illustrated in FIG. 10, the gate structure 26 and dielectric layer 24 may be recessed below a top surface of the source region 27. For example, a selective etch process may be performed to recess the gate structure 26 and dielectric layer 24 surrounding the nanowire structure 106 from the top surface of the source region 27. A second spacer 28 may be formed on the gate structure 26 and portion of the first dielectric layer 24. The second spacer 28 also surrounds a portion of the source region 27 of the nanowire structure 106. The second spacer 28 operates to electrically isolate components of the transistor 105 from components of a subsequently formed capacitor 104. The second spacer 28 may be composed on any type of insulating material. For example, the second spacer 28 may be composed of an undoped silicate glass, a doped silicate glass, organosilicate glass, a porous dielectric material or combinations thereof. In some embodiments, the second spacer 28 is composed of $SiO_2$. Other suitable insulating materials are within the contemplated scope of disclosure.

Figure 12:
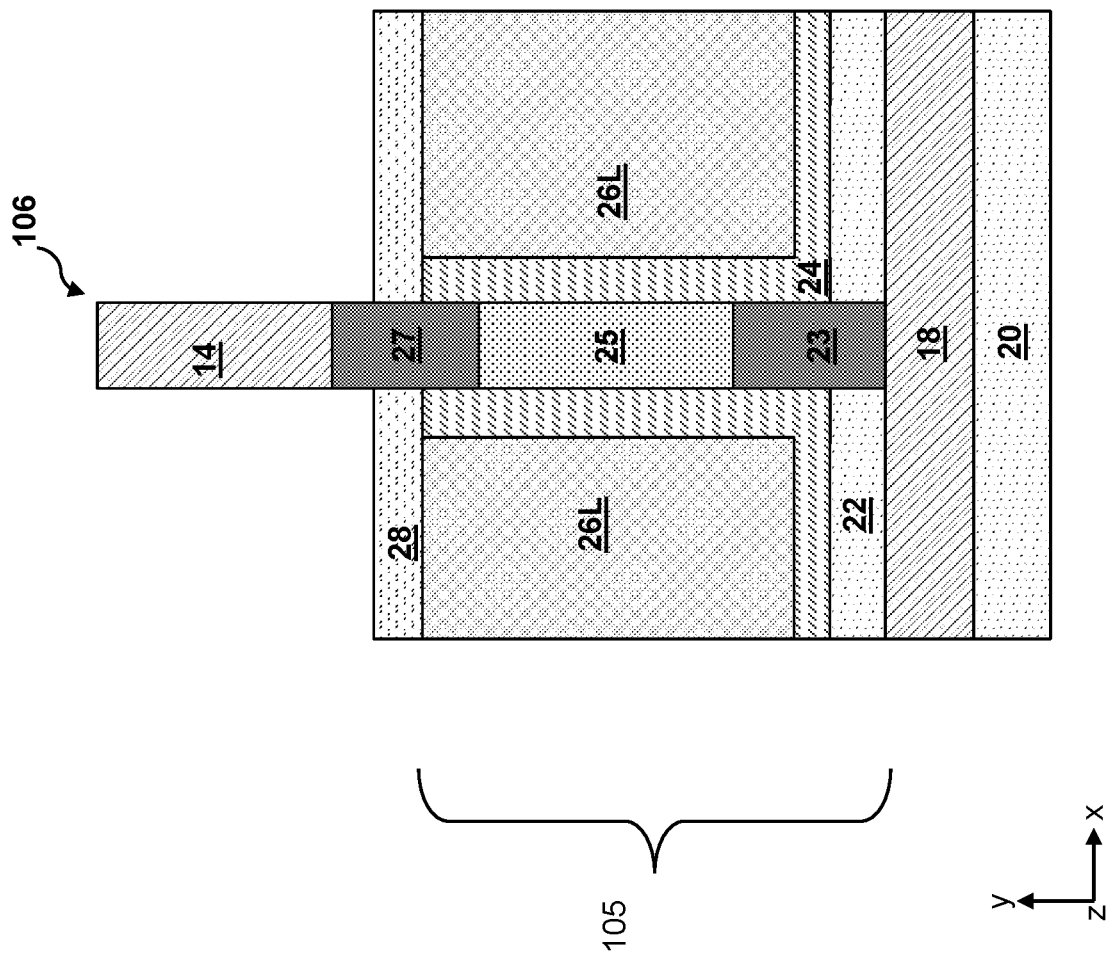
FIG. 12 is a vertical cross-sectional view of the exemplary structure after formation of a first conductor.
Figure 13:
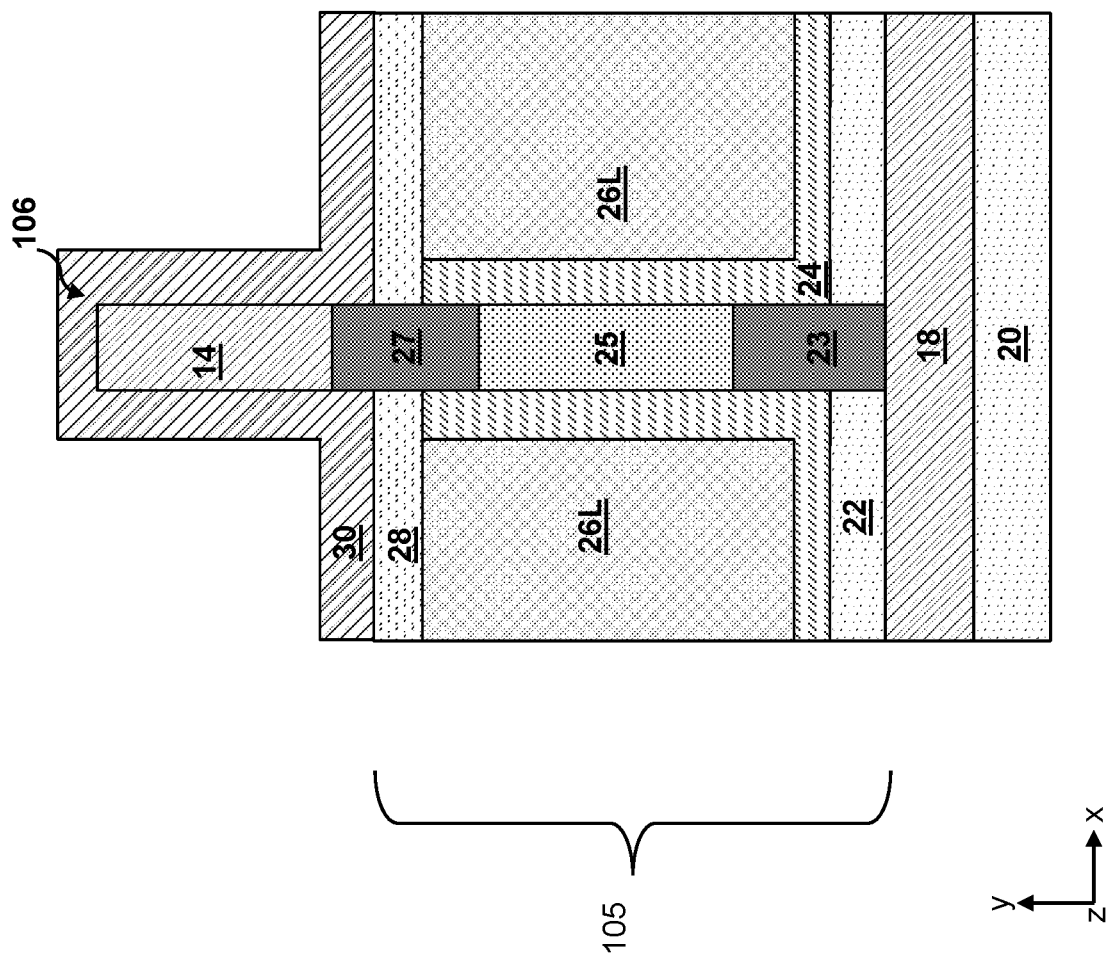
FIG. 13 is a vertical cross-sectional view of the exemplary structure after formation of a second dielectric material.
Figure 14:
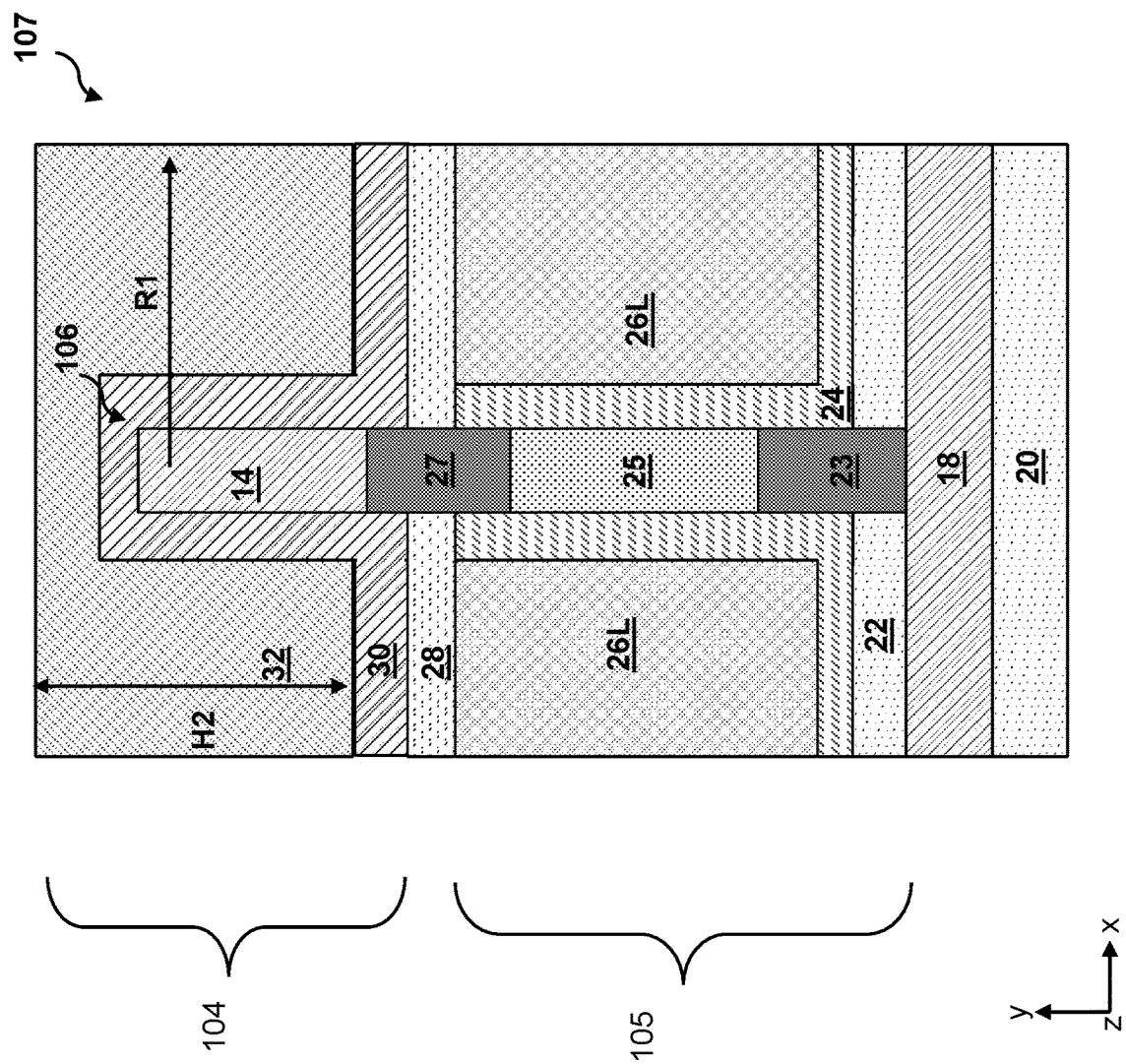
FIG. 14 is a vertical cross-sectional view of the exemplary structure after formation of a second conductor.

FIG. 12 is a vertical cross-sectional view of the exemplary structure after formation of a first conductor 14 structure on the nanowire structure 106. In some embodiments, a blanket layer of first conductor material may be formed on the intermediate structure illustrated in FIG. 11. In some embodiments, the portion of the nanowire structure 106 that corresponds to the first conductor 14 of a subsequently formed capacitive device 104 may be composed of a different material as the source region 27, as illustrated in FIGS. 12-14. In other embodiments, the portion of the nanowire structure 106 that corresponds to the first conductor 14 of the subsequently formed capacitive device 104 may be composed the same material as the source region 27 (see e.g., FIG. 15A). For example, if the source region 27 is formed of an oxide semiconductor, the first conductor 14 may be composed of a metal, metal alloy, and the like, such as Cu, Co, Ru, W, Ti, T, TiN, TaN, Al, TiAl, or combinations thereof. Alternatively, the first conductor 14 is also formed of a semiconductor material such as an oxide semiconductor, for example, ITO, Indium Oxide (e.g., $In_2O_3$), Zinc Oxide (e.g., ZnO), etc. A photoresist layer (not shown) may be deposited over the blanket layer of first conductor material and patterned to mask the nanowire structure 106. The blanket layer of first conductor material may be anisotropically etched to form the first conductor 14 structure of the nanowire structure 106 illustrated in FIG. 12.

FIG. 13 is a vertical cross-sectional view of the exemplary structure after formation of a second dielectric layer 30 on the nanowire structure 106. In some embodiments a blanket layer of second dielectric material may be formed on the intermediate structure illustrated in FIG. 12. In some embodiments, the portion of the nanowire structure 106 that corresponds to the second dielectric layer 30 of a subsequently formed capacitive device 104 may be formed on the second spacer 28 and to surround a portion of the source region 27 and the first conductor 14 of the nanowire structure 106. In some embodiments, the second dielectric layer 30 may be composed of any type of high dielectric constant (high-k) material. For example, the second dielectric layer 30 may be composed of $HfO_2$, $Al_2O_3$, HZO, $HfSiO_x$, $HfLaO_x$, etc. A photoresist layer (not shown) may be deposited over the blanket layer of second dielectric layer 30 and patterned to mask the nanowire structure 106. The blanket layer of second dielectric layer 30 may be etched to form the second dielectric structure of the nanowire structure 106 illustrated in FIG. 13. The second dielectric layer may be deposited in a conformal manner over the second spacer 28 and the nanowire structure 106 by ALD.

FIG. 14 is a vertical cross-sectional view of the exemplary structure after formation of a second conductor 32 structure on the nanowire structure 106. In some embodiments a blanket layer of second conductor material may be formed on the intermediate structure illustrated in FIG. 13. In some embodiments, the portion of the nanowire structure 106 that corresponds to the second conductor 32 of a subsequently formed capacitive device 104 may be formed on the second dielectric layer 30 and to surround a portion of the source region 27, the first conductor 14, and the second dielectric layer 30 of the nanowire structure 106. In some embodiments, the second conductor 32 may be composed of any type of conductive material, such as a metal, metal alloy, composite material, etc. For example, the second conductor may be composed of Cu, Co, Ru, W, Ti, T, TiN, TaN, Al, TiAl, or combinations thereof. The first conductor 14, the second conductor 32, and the second dielectric layer 30 interposed therebetween form a capacitive device 104 (e.g., capacitor) that may store data in the form of a charge for the memory cell 107.

In embodiments, the capacitive device 104 may have dimensions that correspond to the design requirements of the memory cell. In some embodiments, the capacitive device 104 may have a height, H2, and a radius, R1, as measured from the center of the first conductor 14. For example, the capacitive device 104 may have a height, H2, that ranges from approximately 50 nm to approximately 150 nm, and may have a radius, R1, that range from approximately 4 nm to approximately 16 nm.

As discussed above, FIG. 14 is a vertical cross-sectional view of an embodiment memory cells 107 including a vertically-stacked transistor 105 and capacitive device 104, according to embodiments of the present disclosure. FIGS. 15A-15F are vertical cross-sectional views of additional embodiment memory cells 107 including a vertically-stacked transistor 105 and capacitive device 104. While FIG. 15A-15F illustrate various elements, components, and features of a memory cell, one skilled in the art will realize that FIG. 15A-15F illustrate embodiments of a memory cell 107, and that additional elements, components, and features may be added and existing elements, components, and features may be removed.

As illustrated in FIGS. 15A-15F, the memory cell 107 may be arranged such that the transistor 105 and the capacitive device 104 are stacked in a first direction, e.g., the y-direction. That is, the capacitive device 104 may be stacked on the transistor 105 in the y-direction (hereinafter "vertical direction"). As described herein, the "vertical" direction refers to a direction (e.g., y-direction) in which different components, features, or elements of a memory cell (e.g., memory cell 107) are stacked or layered upward to form a semiconductor device such as a DRAM unit. Likewise, as described herein, a "horizontal" direction refers to one or more directions that are orthogonal to the vertical direction (e.g., x-direction or z-direction), in which memory cells are spaced to form an array of memory unit cells as a memory device (e.g., DRAM).

In the various embodiments illustrated in FIGS. 14 and 15A-15F, the transistor 105 and the capacitive device 104 include the nanowire structure 106 that extends in the vertical direction. In embodiments, the nanowire structure 106 forms the drain region 23, the source region 27, and the channel region 25 of the transistor 105. The nanowire structure 106 also forms a first conductor 14 of the capacitive device 104. Because the nanowire structure 106 extends vertically in the first direction (e.g., y-direction), the transistor 105 and the capacitive device 104 may be stacked in the vertical direction. As such, memory cells, such as memory cell 107, occupy less area in the horizontal directions (e.g., x-direction and z-direction.) This allows the memory cells, such as memory cell 107, to be spaced closer together, in the horizontal directions, when forming a memory device (e.g., DRAM.)

Figure 15A:
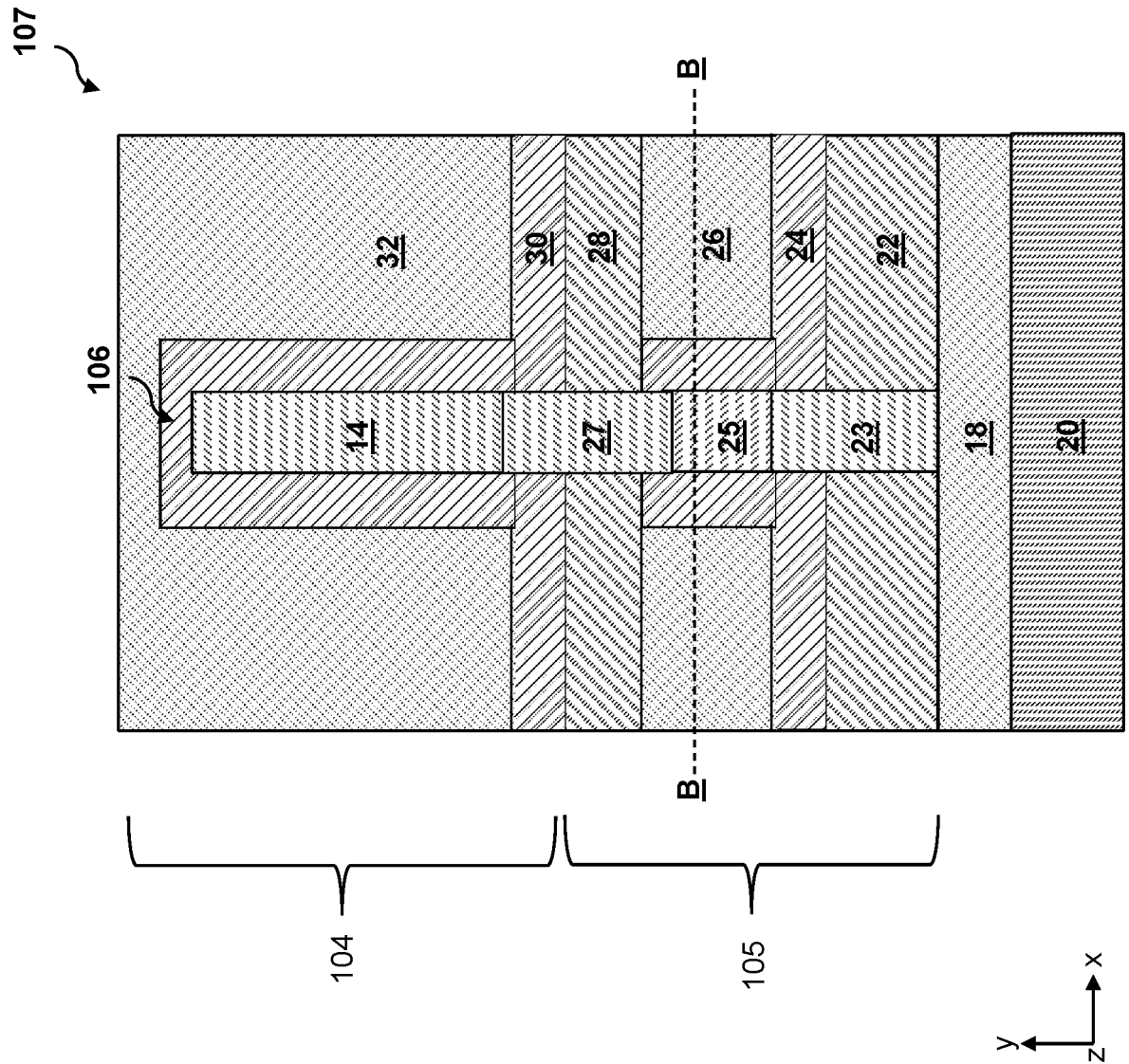
FIGS. 15A-15F are vertical cross-sectional views of alternative embodiment memory cells including a vertically-stacked transistor and capacitive device.

In the embodiment illustrated in FIG. 15A, the memory cell 107 is similar to the embodiment memory cell illustrated in FIG. 14. However, in contrast to the memory cell 107 shown in FIG. 14, the memory cell 107 illustrated in FIG. 15A includes a first conductor 14 that is formed of the same material as drain region 23 and source region 27. In addition, the various spacer and dielectric layers 20, 22, 24, 28, and 30 may be formed from the same dielectric materials. While FIG. 15A illustrates the dielectric layers 20, 22, 24, 28, and 30 being formed of the same material, any one or multiple ones of the dielectric layers 20, 22, 24, 28, and 30 may be formed of different materials.

In the embodiment illustrated in FIG. 15A, the memory cell 107 may be formed using the processes described above in FIGS. 2-14. For example, as illustrated in FIG. 12, when the blanket layer of first conductor material is formed on the intermediate structure illustrated in FIG. 11, the blanket layer of the first conductor may be the same material as drain region 23 and source region 27. In another example, to form the memory cell 107 as illustrated in FIG. 15A, the first conductor 14 may be formed during the process of forming the semiconductor layers 23L, 25L, 27L. For example, when forming the semiconductor layers 23L, 25L, 27L as illustrated in FIG. 4, the semiconductor layer 27L may be formed to a thickness T3 that includes a thickness of the source region 27 and the first conductor 14. For example, the semiconductor layer 27L may be formed to a thickness, T3, that ranges from approximately 100 nm to approximately 200 nm. In this example, the first conductor 14 may be formed when portions of the semiconductor layers 23L, 25L, 27L are removed to form the nanowire structure 106, as illustrated in FIG. 5 and described above.

While the channel region 25, as in FIG. 15A, is described as having the same material as the source region 27, the process described above (e.g., forming the first conductor at the time of forming the drain region 23, channel region 25, and source region 27) may also be utilized to form a channel region 25 comprising different materials from the source region 27. That is, after formation of the semiconductor layers 23L, 25L, 27L, the blanket layer of the first conductor may be formed on the semiconductor layers 23L, 25L, 27L and may be subsequently removed to form the first conductor 14.

In embodiments, as illustrated in FIGS. 14 and 15A, the cross-section dimensions, taken in the x-z plane, of the nanowire structure 106 may be approximately the same along the vertical length of the nanowire structure 106 (e.g., y-direction.) In other embodiments, the cross-section dimensions, taken in the x-z plane, of the nanowire structure 106 may vary along the vertical length of the nanowire structure 106 (e.g., y-direction.)

Figure 15B:
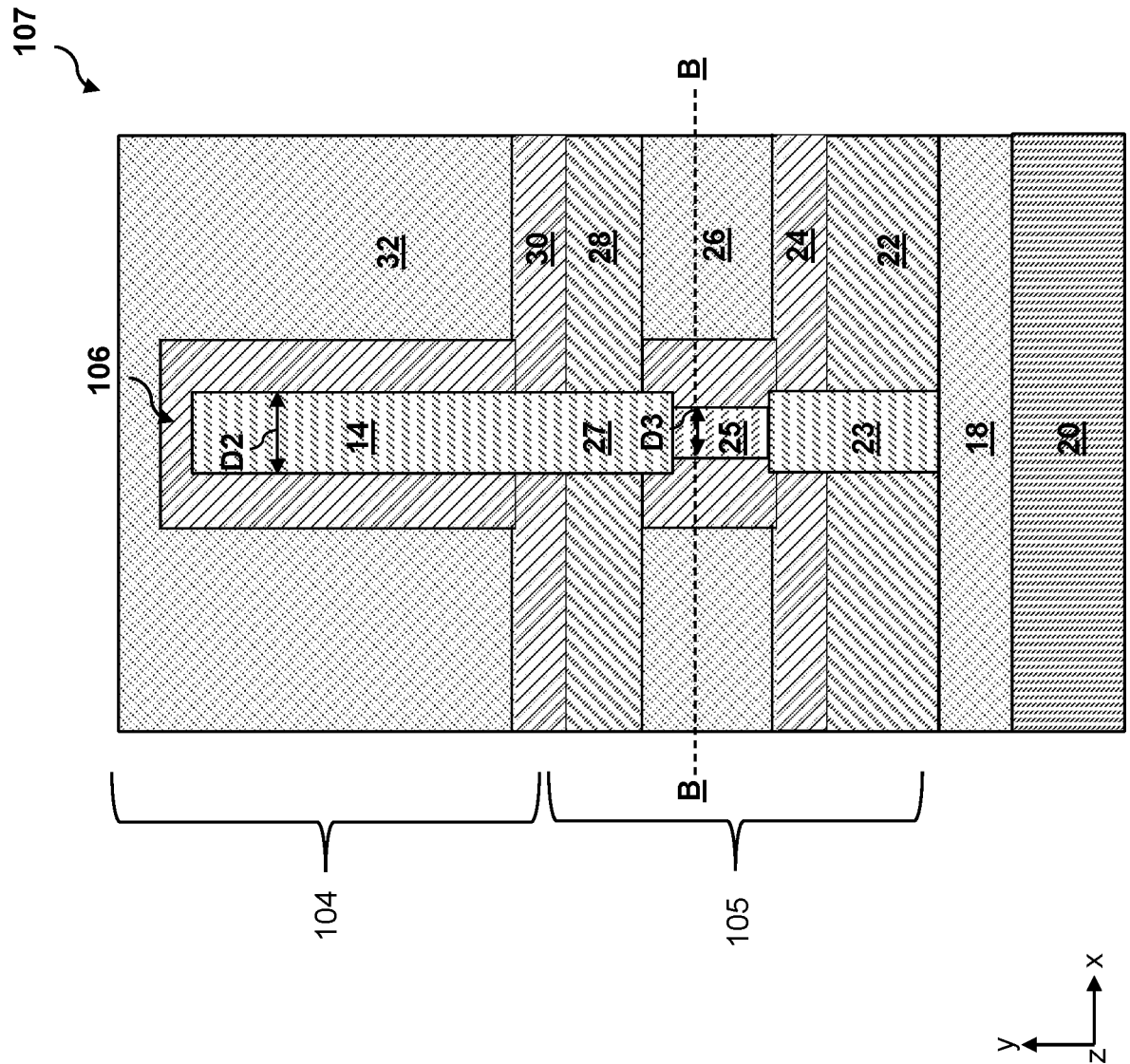

For example, as illustrated in FIG. 15B, in the embodiment memory cell 107 the portion of the nanowire structure 106 that corresponds to the channel region 25 may have cross-sectional dimensions, taken in the x-z plane, that are smaller than the cross-section dimensions, taken in the x-z plane, of other portions of the nanowire structure 106. This configuration creates a channel region 25 that is narrow, which thereby lowers $I_{off}$, and creates a wider source region 27 and drain region 23, which thereby improves contact resistance with other metal features. Additionally, this configuration creates a wider first conductor 14, which thereby increases the capacitance of the capacitive device 104.

In the example illustrated in FIG. 15B, the channel region 25 may be formed having a smaller cross-sectional dimension by utilizing a selective removal process during the removal of portions of the semiconductor layers 23L, 25L, 27L, e.g., by using a selective etching process. For example, in the process described above with reference to FIG. 5, a selective etching process may be utilized such that the semiconductor layer 25L etches at a higher rate than the semiconductor layers 23L and 27L and the first conductor layer. After the selective removal, the nanowire structures 106 are formed having a diameter, D2, and a diameter, D3, that matches the design requirements of the transistor 105 and the capacitive device 104. For example, the nanowire structure within the capacitive device 104 may have diameter D2 of between 5 nm and 20 nm, such as 10 nm, although thicker or thinner capacitive devices 104 may be used. The nanowire structure within the channel region 25 may have diameter D3 of between 4 nm and 8 nm, such as 6 nm, although thicker or thinner channel regions 25 may be used.

Figure 15C:
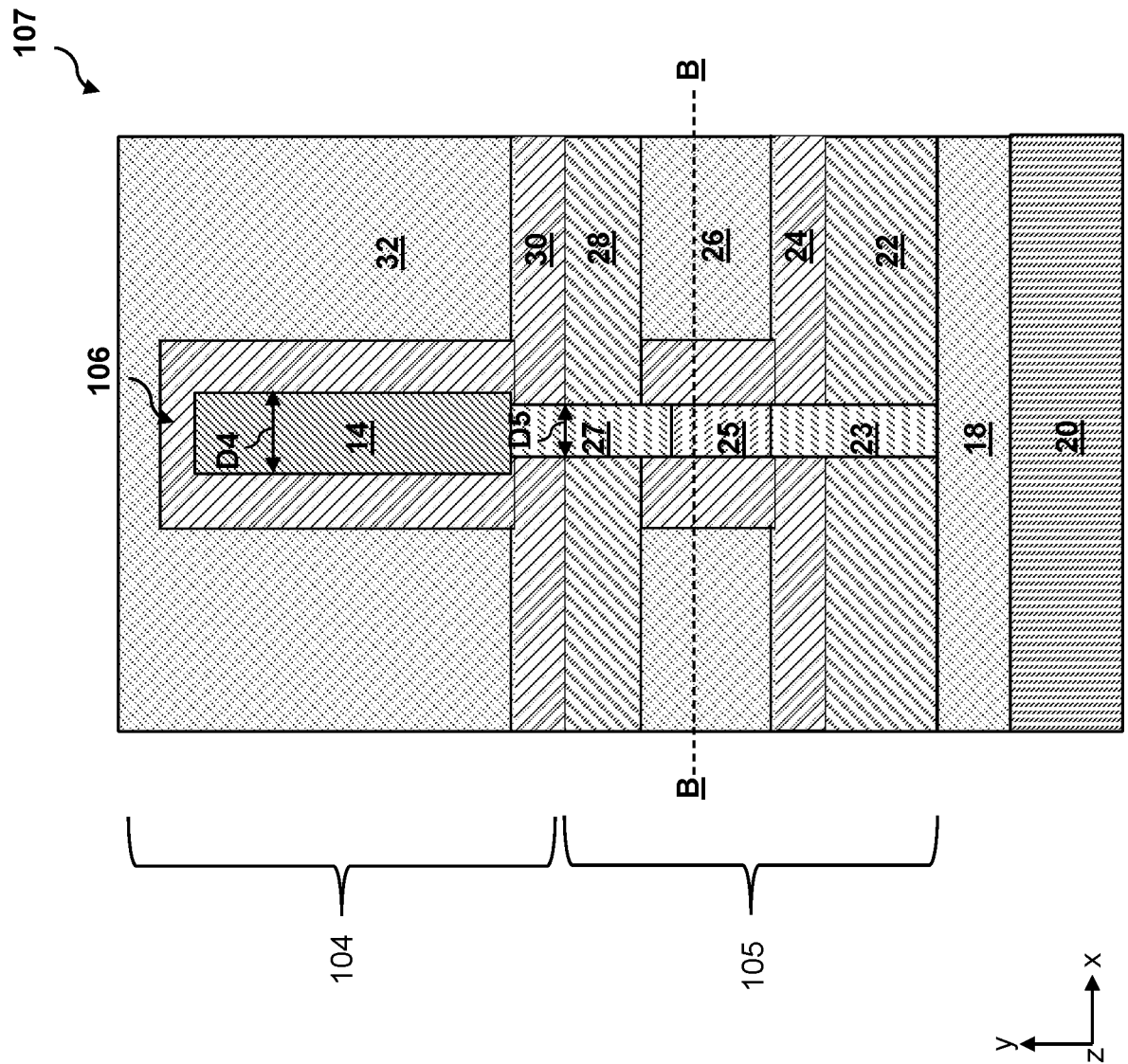

In another embodiment, as illustrated in FIG. 15C, the portion of the nanowire structure 106 that corresponds to the drain region 23, source region 27, and the channel region 25 may have cross-section dimensions, taken in the x-z plane, that are smaller than the cross-section dimensions, taken in the x-z plane, of the first conductor 14 of the nanowire structure 106. This configuration allows for a narrower drain region 23, source region 27, and the channel region 25 and a wider first conductor 14.

In the example illustrated in FIG. 15C, the drain region 23, source region 27, and the channel region 25 may be formed having a smaller cross-sectional dimension by removing differing amounts of the semiconductor layers 23L, 25L, 27L, as illustrated in FIG. 5, relative to the amount of the conductor material removed during formation of the first conductor 14, as illustrated in FIG. 12. Likewise, for example, if the first conductor 14 is formed at the time of the formation of the drain region 23, source region 27, and the channel region 25, as discussed above, the drain region 23, source region 27, and the channel region 25 (relative to the first conductor 14) may be formed having a smaller cross-sectional dimension by utilizing a selective removal process during the removal of portions of the semiconductor layers 23L, 25L, 27L, e.g., by using a selective etching process. For example, as illustrated in FIG. 15C, a selective etching process may be utilized such that the semiconductor layers 23L, 25L, 27L etch at a higher rate than the conductor layer (for the first conductor 14). After the etching, the nanowire structures 106 are formed having a diameter, D4, and a diameter, D5, that matches the design requirements of the transistor 105 and the capacitive device 104. For example, the nanowire structure within the capacitive device 104 may have diameter D4 of between 5 nm and 20 nm, such as 10 nm, although thicker or thinner capacitive devices 104 may be used. The nanowire structure within the transistor region 105 may have diameter D5 of between 4 nm and 8 nm, such as 6 nm, although thicker or thinner transistor regions may be used.

Figure 15D:
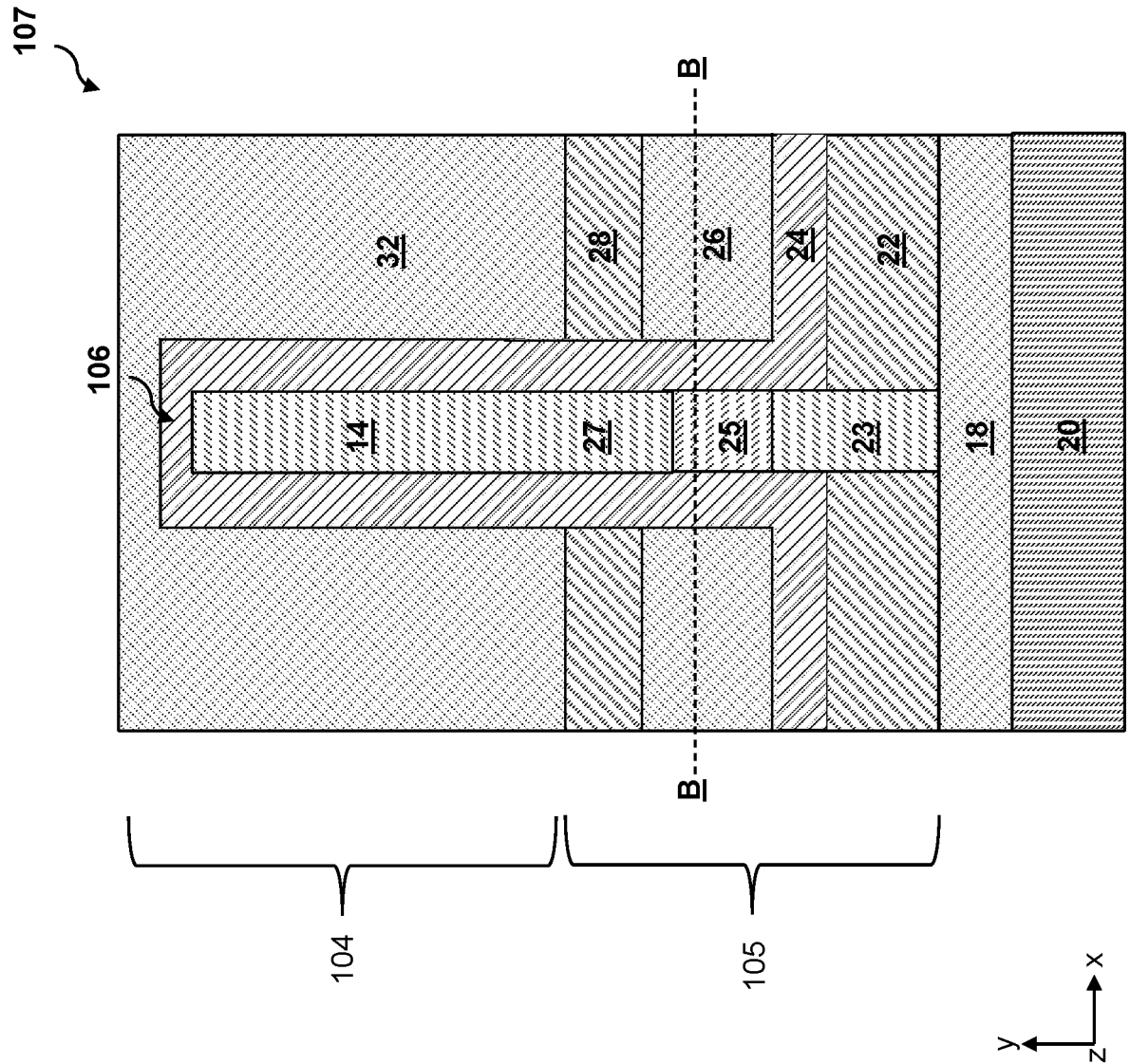
Figure 15E:
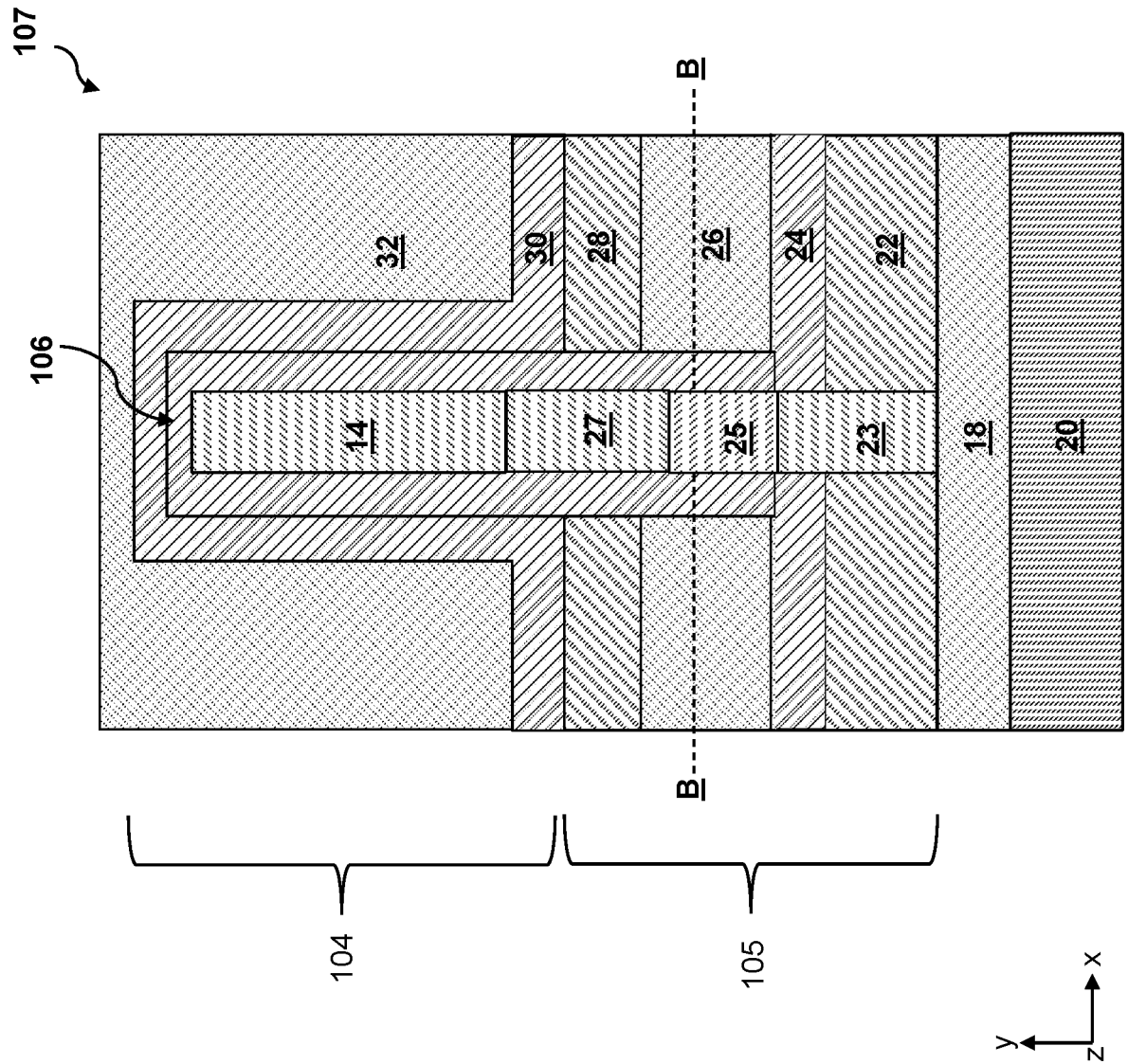

Moreover, in the memory cell 107 of FIGS. 14 and 15A-15C, the transistor 105 and the capacitive device 104 included a first dielectric layer 24 separated from a second dielectric layer 30. In another embodiment, as illustrated in FIG. 15D, the memory cell 107 may include the first dielectric layer 24, which is a single, continuous layer, that vertically extends from the transistor 105 to the capacitive device 104. In other embodiments, as illustrated in FIG. 15E, the memory cell 107 may include the first dielectric layer 24, which is a single, continuous layer, that vertically extends from the transistor 105 to the capacitive device 104. Additionally, the memory cell 107 may include the second dielectric layer 30 that surrounds the first dielectric layer 24.

In the examples illustrated in FIGS. 15D and 15E, the single, continuous layer may be formed by forming the first dielectric layer 24 over the entire nanowire structure 106. For example, if the first conductor 14 is formed at the time of the formation of the drain region 23, source region 27, and the channel region 25, the first dielectric layer 24, as described above in FIG. 8, may be formed to cover the nanowire structure 106 that includes the first conductor 14, thereby forming the single, continuous layer.

Figure 15F:
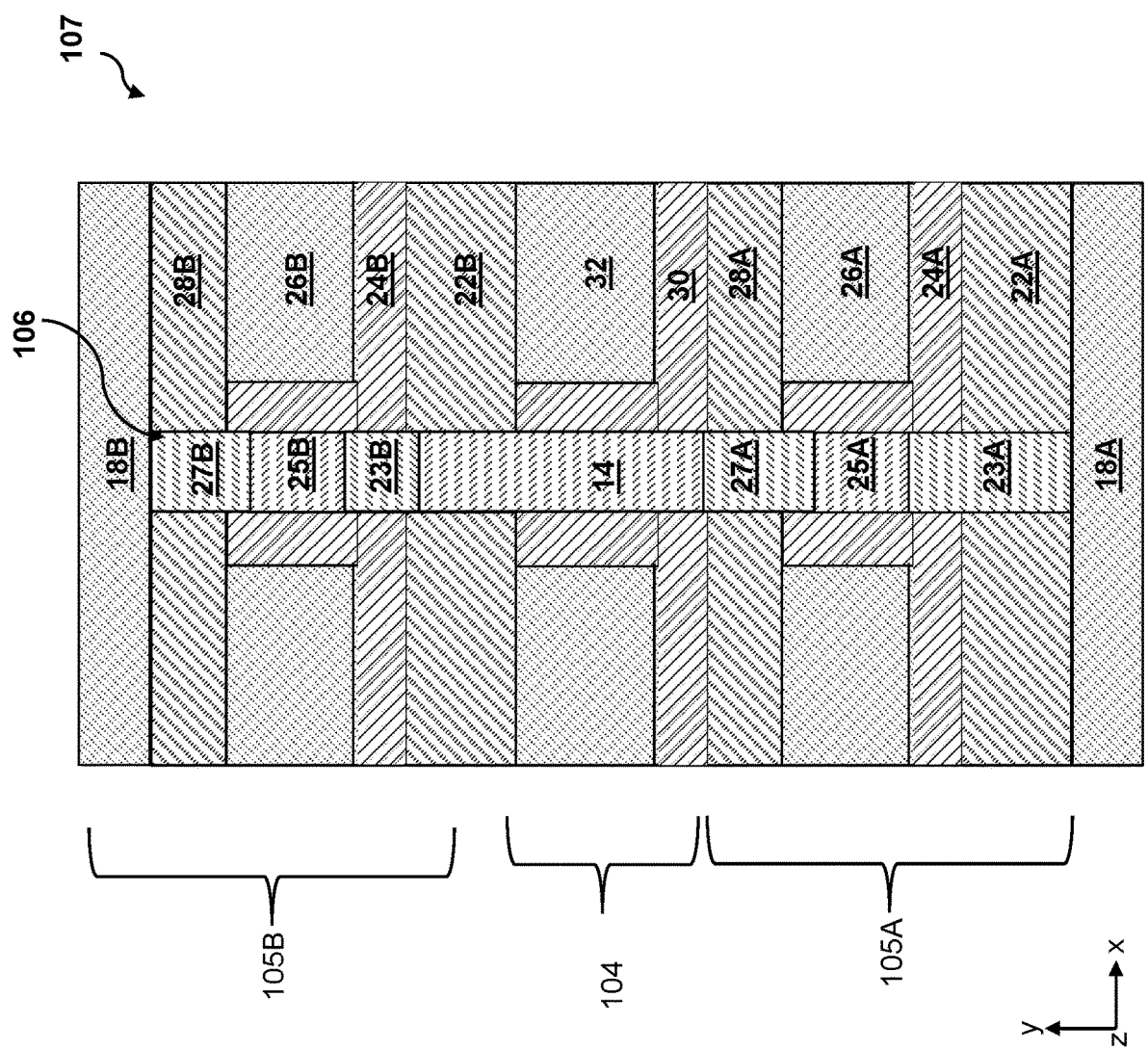

In the embodiments described above with reference to FIGS. 14 and 15A-15E, the memory cell 107 includes a single transistor 105 coupled to the capacitive device 104. In these embodiments, the memory cell 107 may be utilized in memory device that operate at a single data rate. In another embodiment, as illustrated in FIG. 15F, the memory cell 107 may include a first transistor 105A formed over a first bit line 18A, a capacitive device 104, and a second transistor 105B. The first transistor 105A may include a first transistor spacer oxide layer 22A, first drain region 23A, first channel region 25A, first source region 27A, first transistor first dielectric layer 24A, first gate structure 26A, and first transistor second spacer 28A. The capacitive device 104 may include a first conductor 14, second dielectric layer 30, and second conductor 32. The second transistor 105B may include a second transistor spacer oxide layer 22B, second drain region 23B, second channel region 25B, second source region 27B, second transistor first dielectric layer 24B, second gate structure 26B, and second transistor second spacer 28B. The second transistor 105B may be stacked vertically on the capacitive device 104. In this embodiment, the first drain region 23A, the first channel region 25A, the first source region 27A, the first conductor 14, the second drain region 23B, the second channel region 25B, and the second source region 27B may form part of the nanowire structure 106. A second bit line 18B may be formed over the second source region 27B.

Figure 17A:
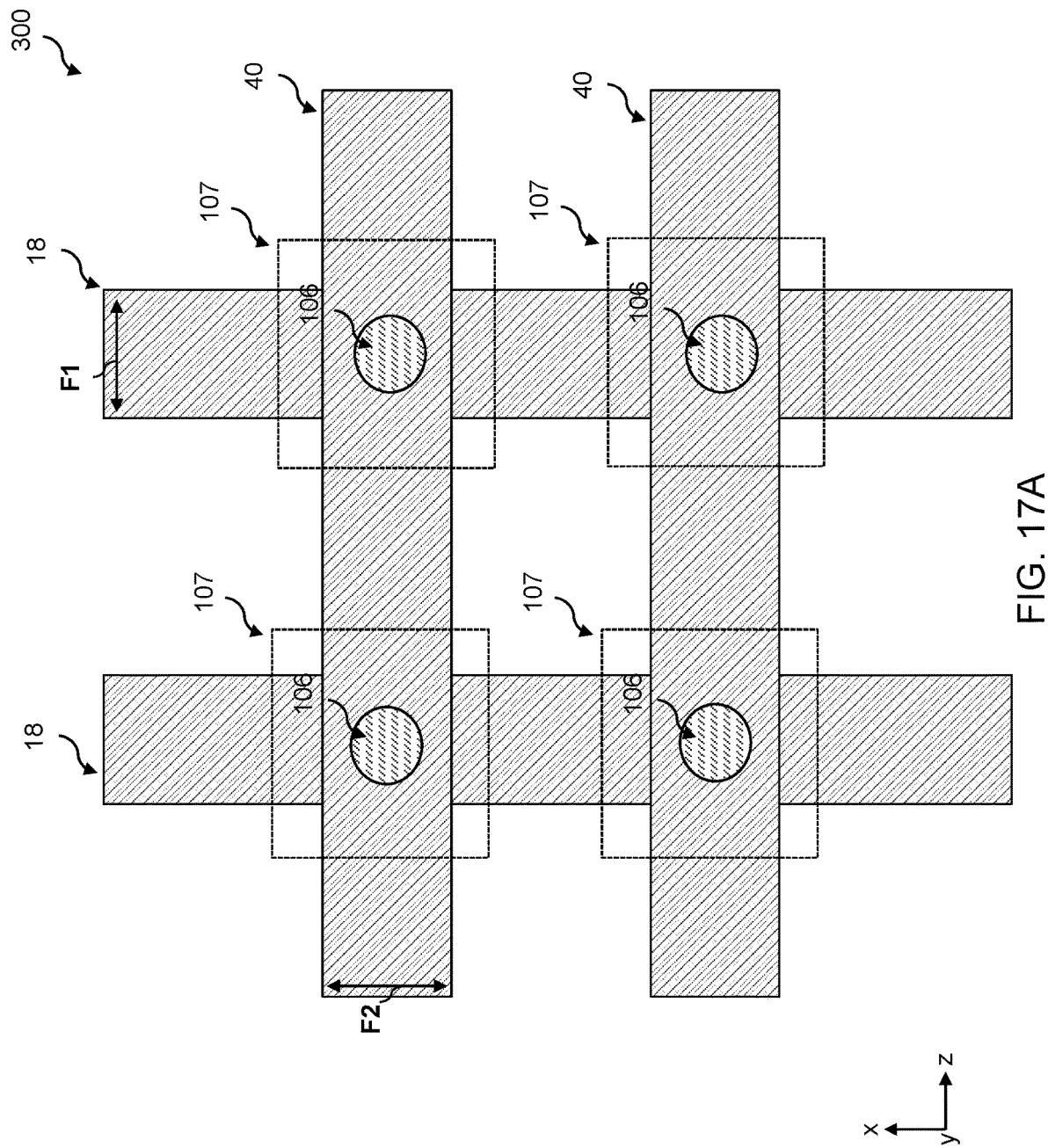
FIGS. 17A and 17B are simplified diagrams, taken in the x-z plane, of a memory unit cell that contains containing four (4) memory cells.
Figure 17B:
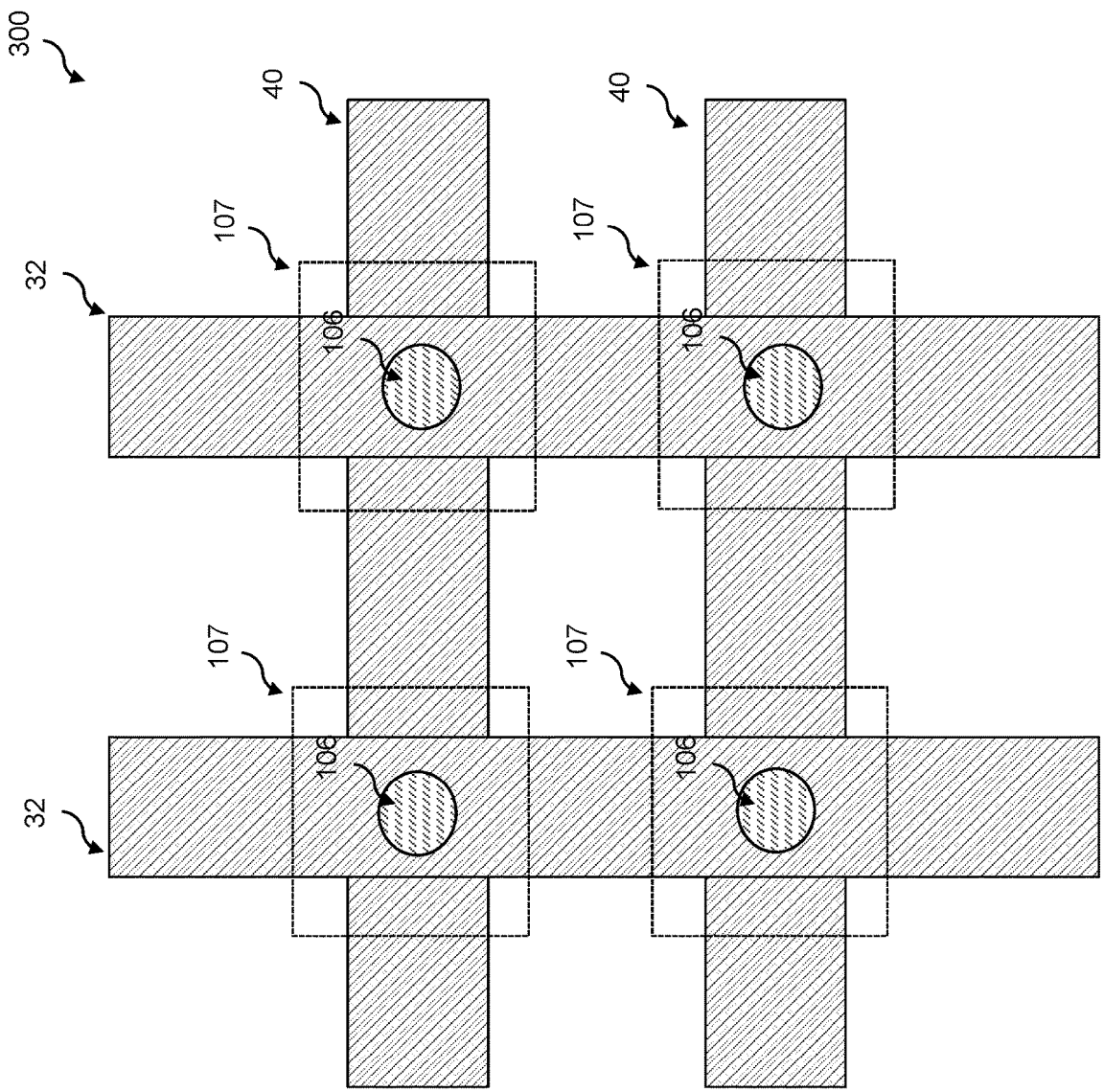

As such, the capacitive device 104 may be accessed (read or written) from either the first transistor 105A or the second transistor 105B. Accordingly, in a memory device containing an array of memory cells 107 (as illustrated in FIGS. 17A and 17B), two rows of memory cells 107, which share the same bit line 18 may be processed in parallel, thereby allowing a double data rate.

While various features of the memory cell 107 have been described separately in FIGS. 14 and 15A-15F, any of features of any memory cells 107 illustrated in FIGS. 14 and 15A-15F may be combined together in a memory unit cell and/or memory device.

Figure 16A:
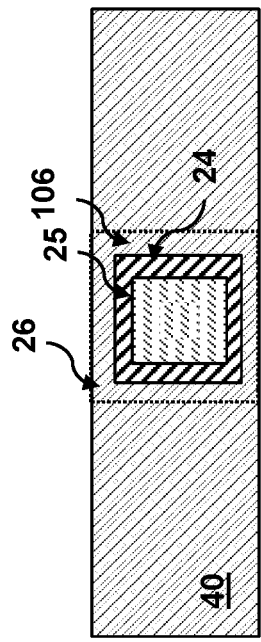
FIGS. 16A-16D are horizontal cross-sectional views taken in the x-z plane, along line B-B in FIG. 15A-15E that illustrate examples of cross-sectional shape of a nanowire structure.

As discussed above, the nanowire structure 106 may extend in the vertical direction (e.g., the y-direction) to form components of the transistor 105 and the capacitive device 104. In embodiments, the nanowire structure 106 may be formed to form various shapes and dimension as required by a design of the memory cell 107. FIGS. 16A-16D are horizontal cross-sectional views taken in the x-z plane, along line B-B in FIG. 15A-15E that illustrate examples of cross-sectional shapes of the nanowire structure 106. In some embodiments, as illustrated in FIG. 16A, the nanowire structure 106 may be a pillar that is a cylindrical structure extending in the vertical direction (e.g., y-direction) having a circular cross section. The first dielectric layer 24 may form a cylindrical ring around a portion of the nanowire structure 106, corresponding to the channel region 25. The first dielectric layer 24 may operate as an insulator between the gate structure 26 and the channel region 25.

Figure 16B:
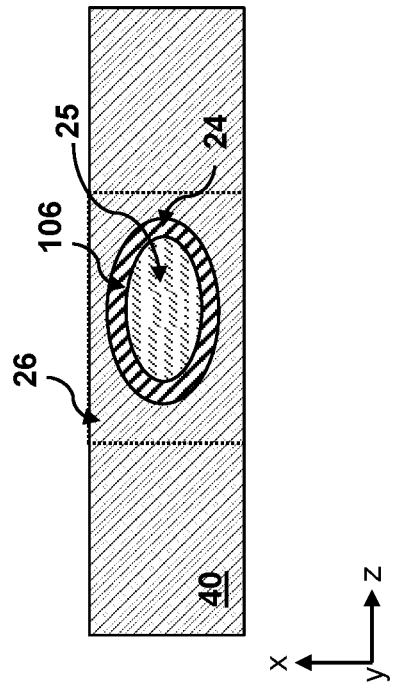

In other embodiments, the nanowire structure 106 may be a pillar with other cross-sections that are not circular. In some embodiments, as illustrated in FIG. 16B, the nanowire structure 106 may be a pillar that is a cuboid structure extending in the vertical direction (e.g., y-direction) having a square cross section. In this embodiment, the first dielectric layer 24 forms a square box around a portion nanowire structure 106, corresponding to the channel region 25. In embodiments, corners of the square cross-section of the nanowire structure 106 may or may not be rounded.

Figure 16C:
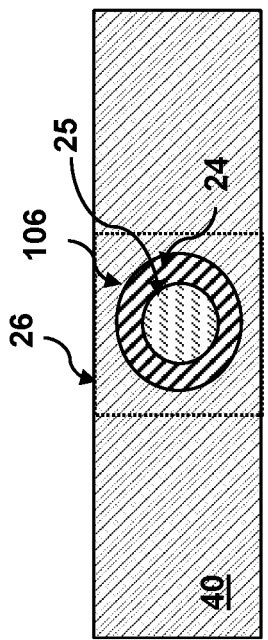

In some embodiments, as illustrated in FIG. 16C, the nanowire structure 106 may be a pillar that is a cuboid structure extending in the vertical direction (e.g., y-direction) having a rectangular cross section. In this embodiment, the first dielectric layer 24 forms a rectangular box around a portion of the nanowire structure 106, corresponding to the channel region 25. In embodiments, corners of the rectangular cross-section of the nanowire structure 106 may or may not be rounded.

Figure 16D:
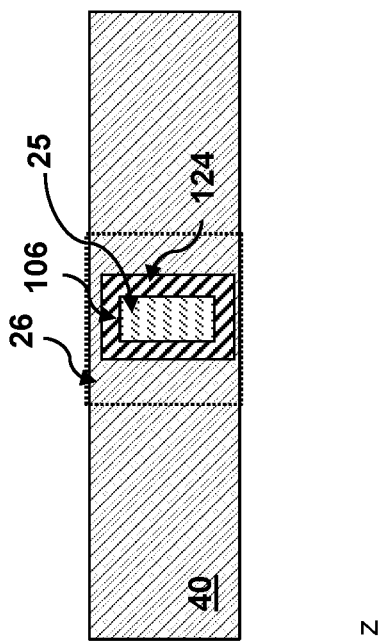

In some embodiments, as illustrated in FIG. 16D, the nanowire structure 106 may be a pillar that is a cylindrical structure extending in the vertical direction (e.g., y-direction) having an elliptical cross section. In this embodiment, the first dielectric layer 24 forms an elliptical ring around a portion of the nanowire structure 106, corresponding to the channel region 25.

Additionally, as illustrated in FIGS. 16A-16D, the gate structure 26 forms part of the word line 40. For example, the word line 40 and the gate structure 26 may be formed of the same material using the same process discussed above, e.g., formed from gate layer 26L. In a memory unit cell, as discussed below with reference to FIGS. 17A and 17B, the word line 40 may connect the gate structures 26 of adjacent memory cell units that are arranged in a line along the z-direction.

While FIGS. 16A-16D illustrates several examples of the shape of the nanowire structure 106, the nanowire structure 106 may be formed in any shape having any type of regular or irregular cross section. For example, the nanowire structure 106 may have triangular or polygonal cross sections.

As discussed above, the memory cell 107 illustrated in FIGS. 14 and 15A-15F may form a portion or part of a memory device. FIGS. 17A and 17B are simplified diagrams, taken in the x-z plane, of a memory unit cell 300 that contains four (4) memory cells 107. While FIGS. 17A and 17B illustrate various elements, components, and features of a memory cell, one skilled in the art will realize that FIGS. 17A and 17B are one example of a memory unit cell, and that additionally elements, components, and features may be added and existing elements, components, and features may be removed.

FIG. 17A illustrates a simplified view of the memory unit cell 300 in which the relationship of the bit lines 18 and the word lines 40 are shown. As illustrated in FIG. 17A, the memory unit cell 300 may include memory cells 107 that are arranged in an array. In the memory unit cell 300, the bit lines 18 and the word lines 40 are formed as perpendicular lines, e.g., the bit lines 18 extending in the x-direction and the word lines 40 extending in the z-direction. A bit line 18 may couple the drain regions 23 of memory cells that are arranged along the bit line 18 in the x-direction. A word line 40 may couple the gate structure 26 of memory cells 107 that are arranged along the word line 40 in the z-direction.

Each of the memory cells 107 may be formed at the intersection of a bit line 18 and a word line 40. In embodiments, each of the bit lines 18 may have a width F1 and each of the word lines 40 may have a width F2. If the widths F1 and F2 correspond to a minimum feature size of the memory cells 107, the memory unit cell 300 may have a working area of 4(F1*F2) or $4F^2$ if the width of the bit lines 18 and the word lines 40 are equal.

FIG. 17B illustrates a simplified view of the memory unit cell 300 in which the relationship of the word lines 40 and the second conductors 32 of the capacitive devices 104 of the memory cells 107 are shown. As illustrated in FIG. 17B, the second conductors 32 may be formed as rectangular plates (shown as 2D rectangles). The second conductors 32 may be arranged perpendicular to the word lines 40 (and parallel to the bit lines 18). While FIG. 17B illustrates the second conductors 32 of the capacitive devices 104 of the memory cells 107 as rectangular plates, one skilled in the art will realize that the second conductors 32 may be formed as a single plate coupling each of the memory cells 107.

While FIGS. 17A and 17B illustrates a single memory unit cell 300 containing 4 memory cells 107, one skilled in the art will realize that the memory unit cell 300 may be a part of a memory device (e.g., DRAM) that contain multiple memory unit cells 300. Moreover, while a memory unit cell 300 is described as containing 4 memory cells 107, one skilled in the art will realize that a memory unit cell 300 may be include any number of memory cells 107.

Figure 18:
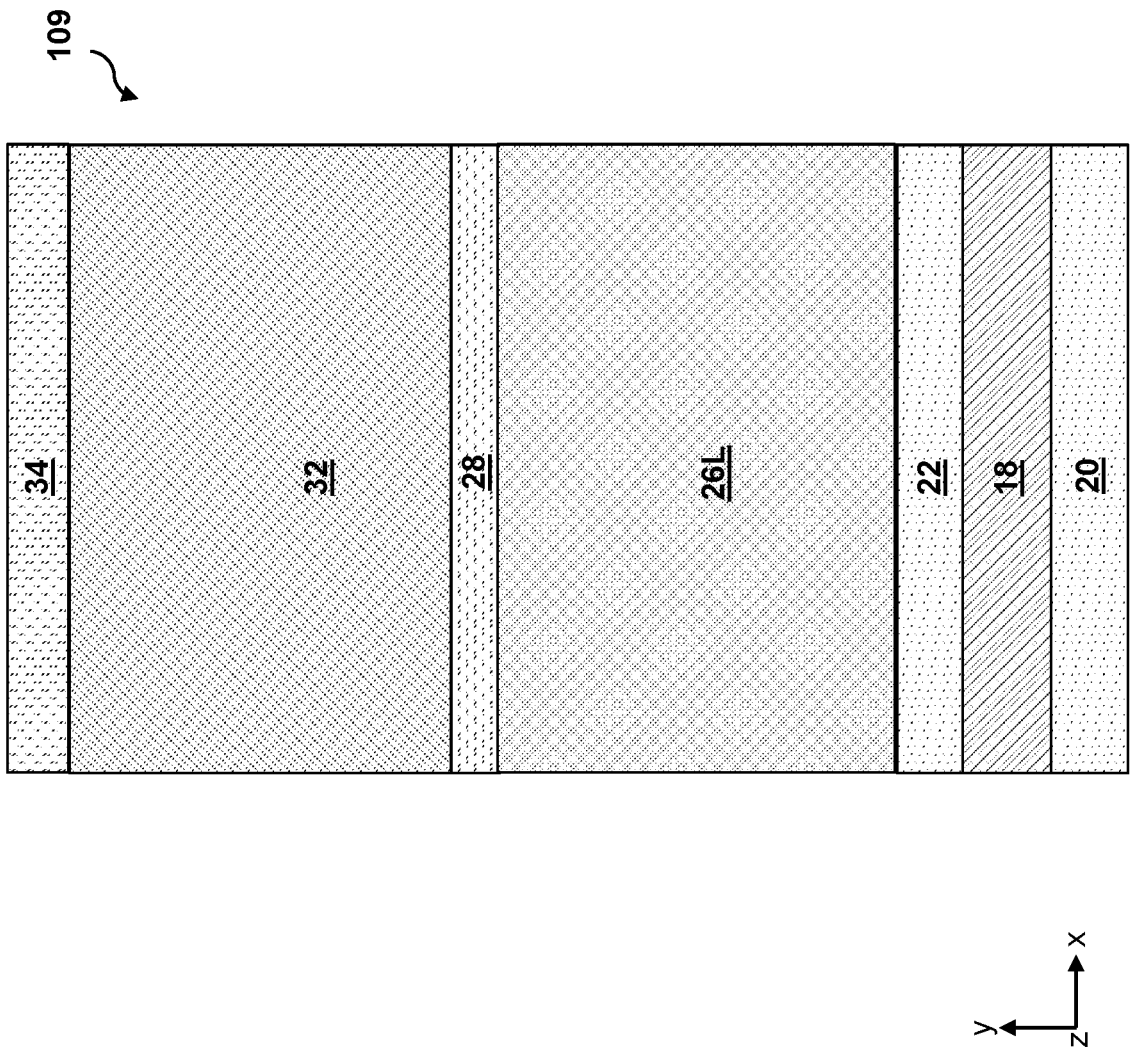
FIG. 18 is a vertical cross-sectional view of the exemplary structure after formation of several layers of a memory cell.

As described above, an embodiment nanowire structure 106 may be formed by vertically "building-up" the nanowire structure. That is, the nanowire structure 106 may be formed and then other elements of the transistor 105 and the capacitive device may be formed around the nanowire structure. In alternative embodiments, the nanowire structure 106 may be formed after the formation of the other components of the transistor 105 and the capacitive device 104. FIG. 18 is a vertical cross-sectional view of the exemplary structure after formation of the ILD layer 20, the bit line 18, the spacer oxide layer 22, the gate layer 26L, the second spacer 28, the second conductor 32 for a memory cell 109. In embodiments, the ILD layer 20, the bit line 18, the spacer oxide layer 22, the gate layer 26L, the second spacer 28, the second conductor 32 for a memory cell 109, in which the stages for forming the nanowire structure 106 and the dielectric layers (e.g., dielectric layers 24 and 30) have been omitted. A hard mask 34 may be formed over the second conductor 32. The hard mask 34 may be formed using any type of deposition process (e.g., PVD, CVD, etc.)

Figure 19:
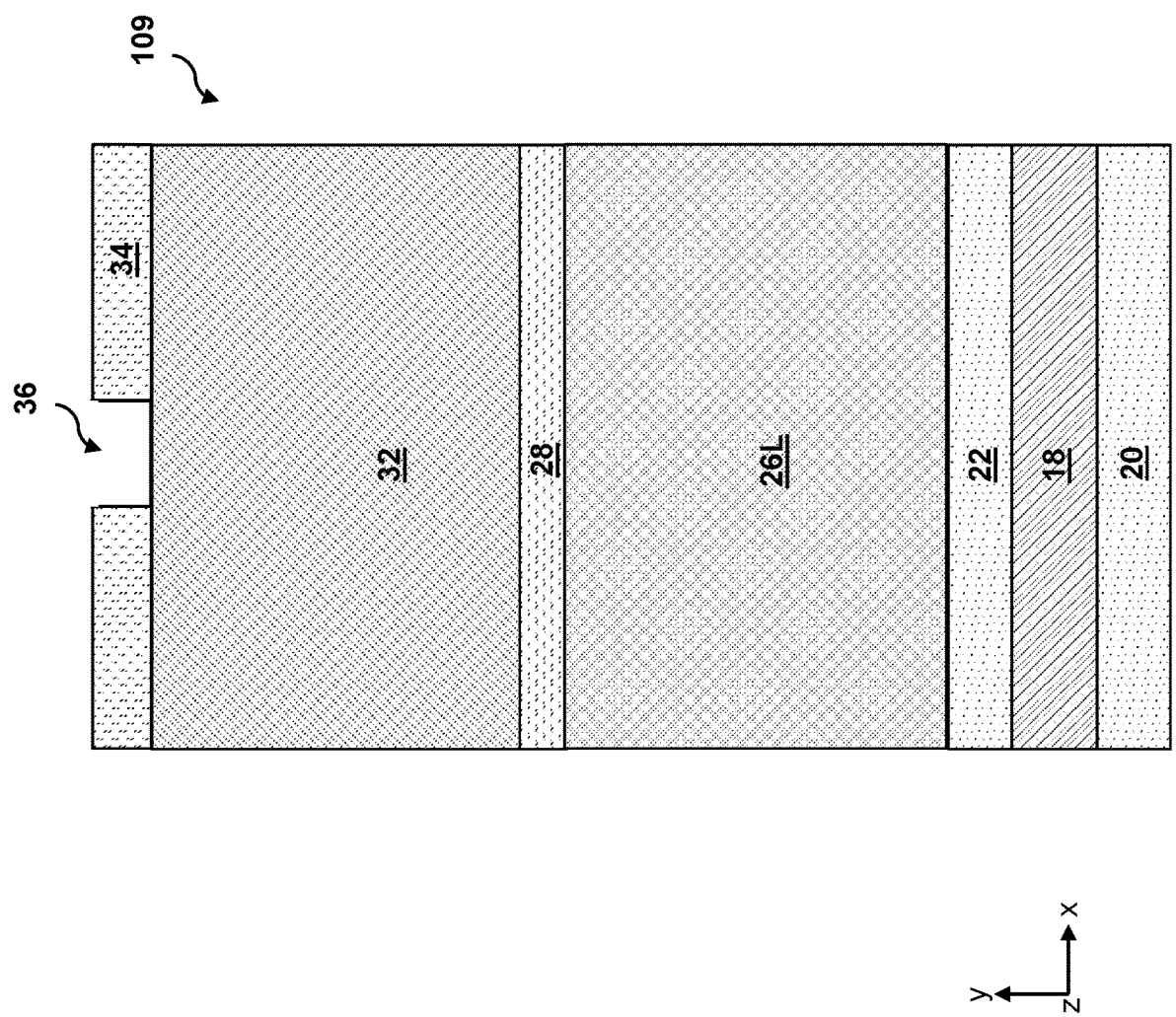
FIG. 19 is a vertical cross-sectional view of the exemplary structure after formation of a hard mask and a nanowire cavity in the hard mask.

FIG. 19 is a vertical cross-sectional view of the exemplary structure after formation of nanowire cavity 36 in hard mask 34. The nanowire cavity 36 may be formed in the hard mask 34 by patterning or otherwise removing portions of the hard mask 34. The patterning or removal of the material of hard mask 34 may be performed in any suitable manner, such as via a masking and etching process, etc. The nanowire cavity 36 may be shaped and sized to match a desired shape and dimensions of the nanowire structure 106.

For example, FIG. 20A is a top-down view of the exemplary structure of FIG. 19 showing the nanowire cavity 36 having a circular cross-section, which corresponds to a nanowire structure 106 having a cylindrical shape. The vertical plane C-C is the plane of the vertical cross-section of FIG. 19. Additionally, the nanowire cavity 36 may have other cross-sections that are not circular that correspond to different shaped nanowire structures 106. For example, FIG. 20B is a top-down view of the exemplary structure of FIG. 19 showing a nanowire cavity 36 having a square cross-section, which corresponds to the nanowire structure 106 as a cuboid nanowire. The vertical plane C-C is the plane of the vertical cross-section of FIG. 19. The corners of the square cross-section may or may not be rounded. As another example, FIG. 20C is a top-down view of the exemplary structure of FIG. 19 showing the nanowire cavity 36 having a rectangular cross-section, which corresponds to the nanowire structure 106 as a cuboid nanowire. The vertical plane C-C is the plane of the vertical cross-section of FIG. 19. The corners of the rectangular cross-section may or may not be rounded. In some embodiments, the nanowire structure 106 may be a pillar that is an oval-cross section structure extending in the stacked-up direction. For example, FIG. 20D is a top-down view of the exemplary structure of FIG. 19 showing a nanowire cavity 36 having an oval cross-section, which corresponds to the nanowire structure 106 as a nanowire having an oval cross-section. The vertical plane C-C is the plane of the vertical cross-section of FIG. 19. Other cross-sectional shapes are within the contemplated scope of the disclosure. For example, triangular or polygonal cross sections may be within the contemplated scope of disclosure.

Figure 21:
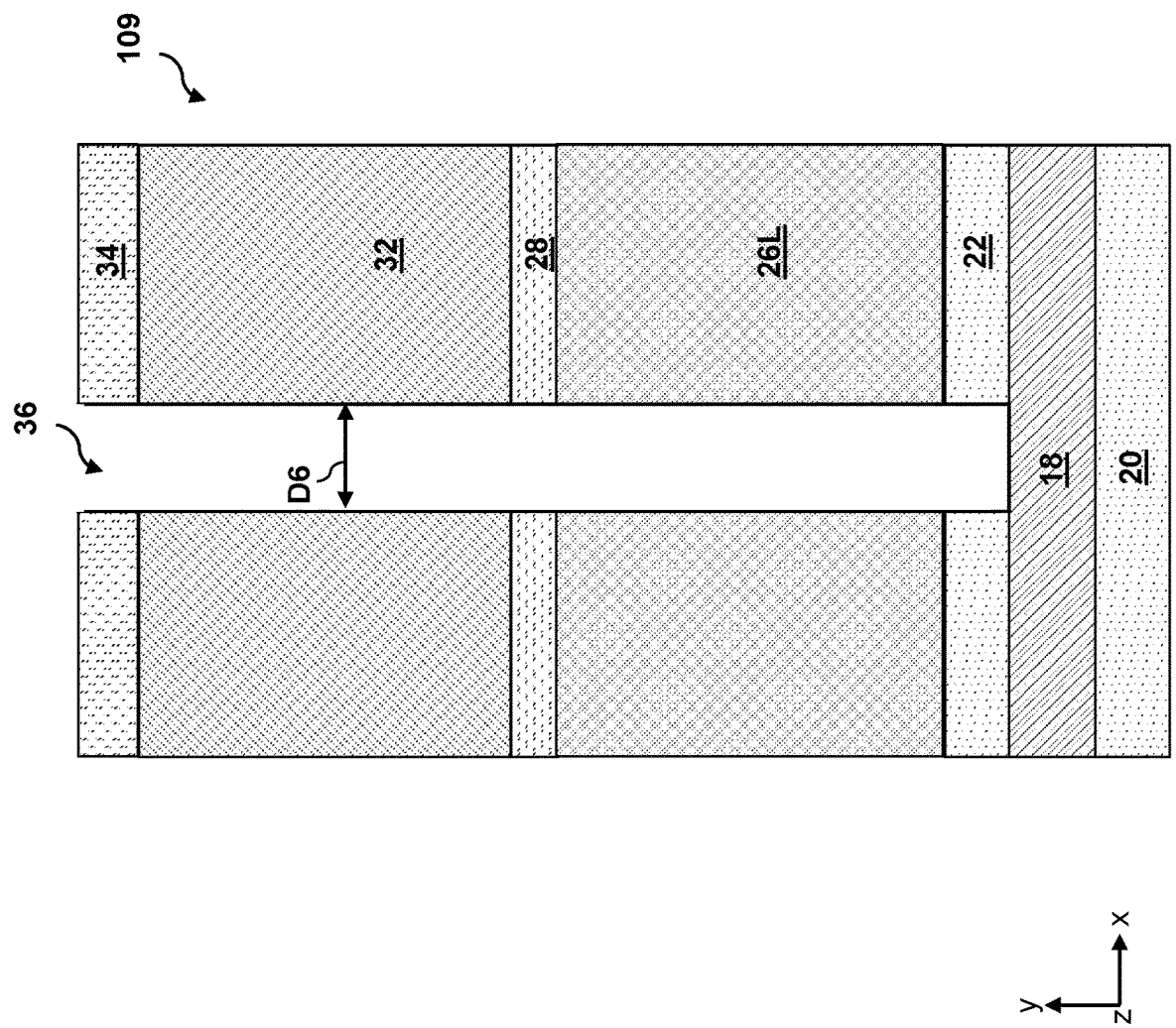
FIG. 21 is a vertical cross-sectional view of the exemplary structure after extension of nanowire cavity into the layers of the memory cell.

FIG. 21 is a vertical cross-sectional view of the exemplary structure after the nanowire cavity 36 has been extended into lower layers. To extend the nanowire cavity 36, portions of the spacer oxide layer 22, the gate layer 26L, the second spacer 28, the second conductor 32 may be etched and removed. The patterning or removal of the spacer oxide layer 22, the gate layer 26L, the second spacer 28, the second conductor 32 may be performed in any suitable manner, such as an anisotropic etching process, using the hard mask 34 as a mask. For each layer, a selective anisotropic etching process may be used that etches the desired layer while not etching other layers. As discussed above, after the various selective etching processes are complete, the nanowire cavity 36 may be formed having a diameter, D6, that matches the design requirements of the transistor 105 and the capacitive device 104. For example, D6 may correspond to any of the example dimensions described above.

Figure 22:
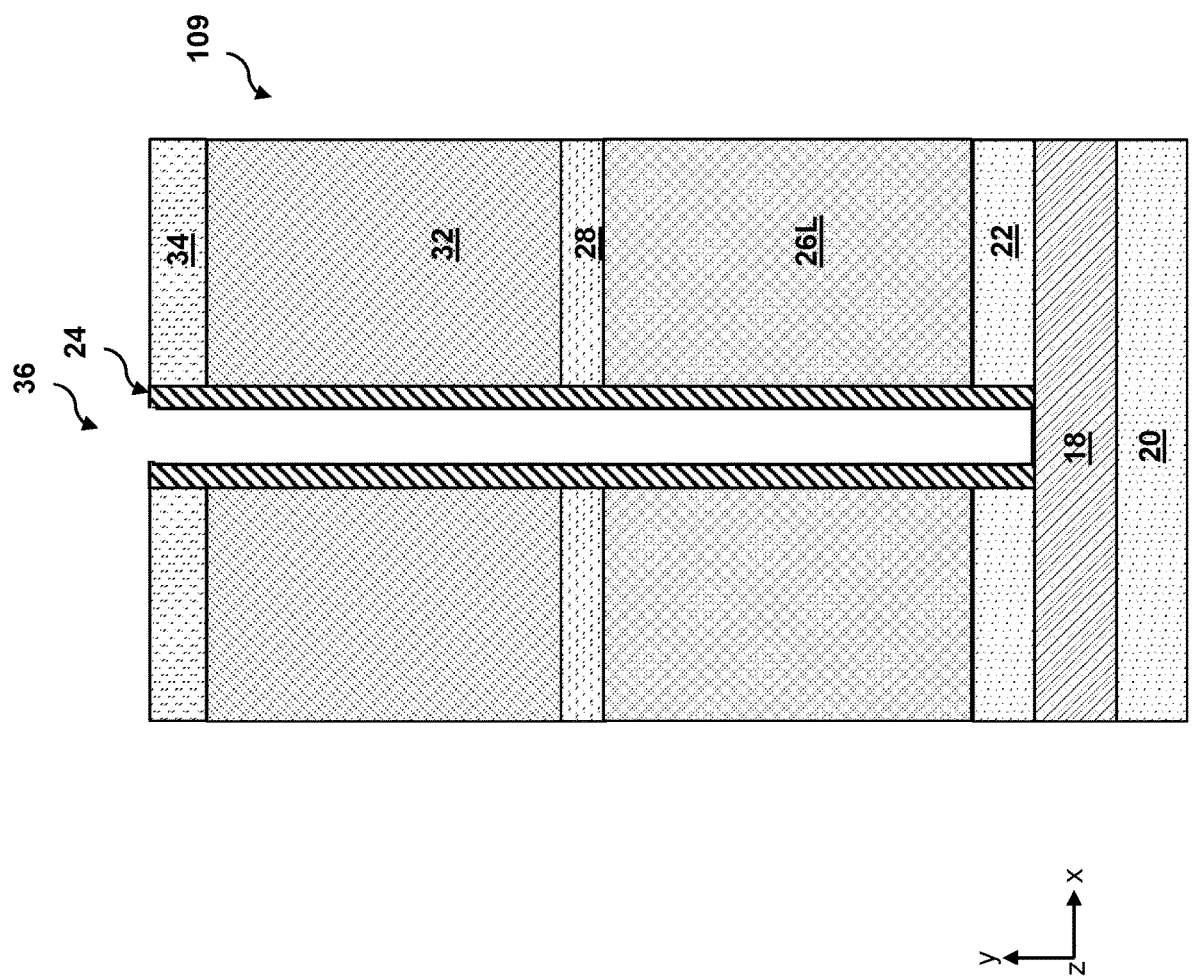
FIG. 22 is a vertical cross-sectional view of the exemplary structure after formation of a dielectric layer in the nanowire cavity.

FIG. 22 is a vertical cross-sectional view of the exemplary structure after the dielectric layer 24 has been formed. For example, a layer of dielectric material may be formed on the hard mask 34 and extending down through the nanowire cavities 36. In some embodiments, the layer of dielectric material may be formed by a conformal deposition process such as ALD. After formation, portions of the layer of dielectric material may be removed to form the dielectric layer 24. The removal of portion of the layer of dielectric material may be performed in any suitable manner, such as an anisotropic etching process. Thus, in some embodiments, portions of the layer of dielectric material may be removed from the surface of the hard mask 34 and from the surface of the bit line 18 within the nanowire cavities 36 thereby forming the dielectric layer 24. In embodiments, the dielectric layer 24 serves as an insulating layer for the transistor 105 and the capacitive device 104.

As discussed above, the dielectric layer 24 may be formed to a thickness as required by the design of the transistor 105 and the capacitive device 104, e.g., thickness as required as an insulator between the gate structure 26 and the channel region 25, and between the first conductor 14 and the second conductor 32. In embodiments, the dielectric layer 24 may be formed of any type of high-k material. For example, the dielectric layer 24 may be formed of $HfO_2$, $Al_2O_3$, HZO, HfSiOx, HfLaOx, etc.

Figure 23:
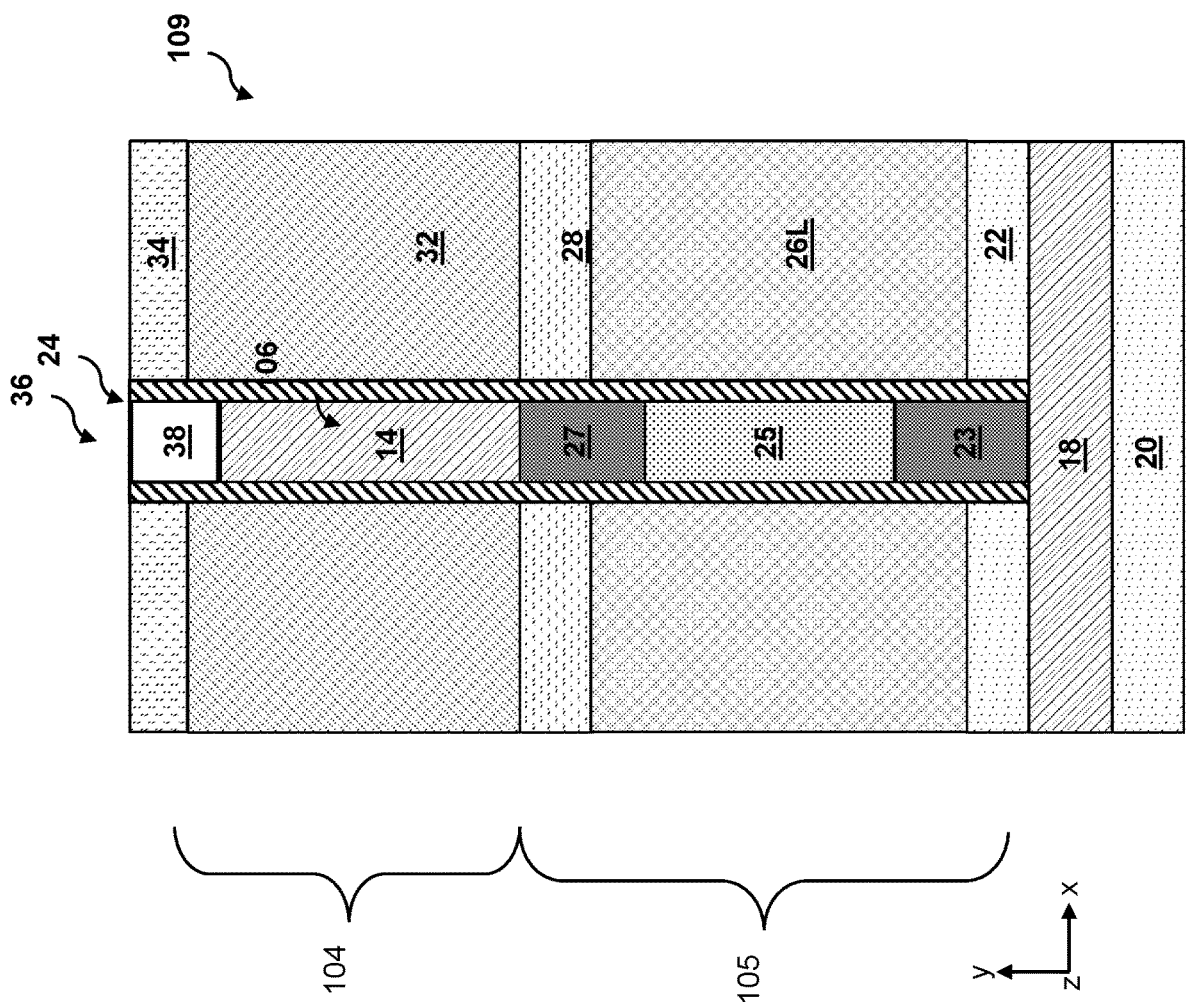
FIG. 23 is a vertical cross-sectional view of the exemplary structure after formation of nanowire structure in the nanowire cavity.

FIG. 23 is a vertical cross-sectional view of the exemplary structure after the nanowire structure 106 has been formed. The nanowire structure 106 may be formed within the nanowire cavity 36. In embodiments, the nanowire structure 106 may be formed by sequentially depositing a series of semiconductor layers (e.g., semiconductor layers 23L, 25L, 27L) similar to the processes described above.

For example, as described above with reference to FIG. 4, the semiconductor layers 23L, 25L, 27L may be formed in three layers stacked up in the y-direction, filling the nanowire cavity. As such, a first semiconductor layer 23L may be a bottom layer deposited on the bit line 18 thereby forming the drain region 23. A second semiconductor layer 25L may be a middle layer deposited on the bottom semiconductor layer 23L, thereby forming the channel region 25. The third semiconductor layer 27L may be a top layer deposited on the middle semiconductor layer 25L, thereby forming the source region 27. The semiconductor layers 23L, 25L, 27L may be deposited sequentially on top of one another in the y-direction such that the semiconductor layer 23L may be deposited first, the semiconductor layer 25L may be deposited second, and the semiconductor layer 27L may be deposited third. The semiconductor layers 23L, 25L, 27L may be formed by a conformal or non-conformal deposition process, such as PVD, ALD, etc. The semiconductor layers 23L, 25L, 27L may be formed from oxide semiconductors such as IGZO, ITO, $Ga_2O_3$, $In_2O_3$, ZnO, etc. Other suitable materials for use as the semiconductor layers 23L, 25L, 27L are within the contemplated scope of the disclosure. As discussed above, the semiconductor layers 23L, 25L, 27L may deposited in respective thicknesses as required by the design of the transistor 105.

Likewise, as discussed above, a first conductor 14 may be formed as a top portion of the nanowire 106. In some embodiments, the portion of the nanowire structure 106 that corresponds to the first conductor 14 of a subsequently formed capacitive device 104 may be composed of a different material as the source region 27, as illustrated in FIGS. 12-14. In other embodiments, the portion of the nanowire structure 106 that corresponds to the first conductor 14 of the subsequently formed capacitive device 104 may be composed the same material as the source region 27 (see e.g., FIG. 15A). For example, if the source region 27 is formed of an oxide semiconducting material, the first conductor 14 may be composed of a metal, metal alloy, and the like, such as Cu, Co, Ru, W, Ti, T, TiN, TaN, Al, TiAl, or combinations thereof. Alternatively, first conductor 14 is also formed of a semiconductor material such as an oxide semiconductor, for example, ITO, Indium Oxide (e.g., $In_2O_3$), Zinc Oxide (e.g., ZnO), etc.

Additionally, an isolating cap 38 may be formed on top of the nanowire structure 106. The isolating cap 38 may be formed using any type of deposition process, e.g., a CVD, PVD, ALD, or the like. The isolating cap 38 may be formed of any type of metal or semiconductor oxide, such as $SiO_2$.

Figure 24:
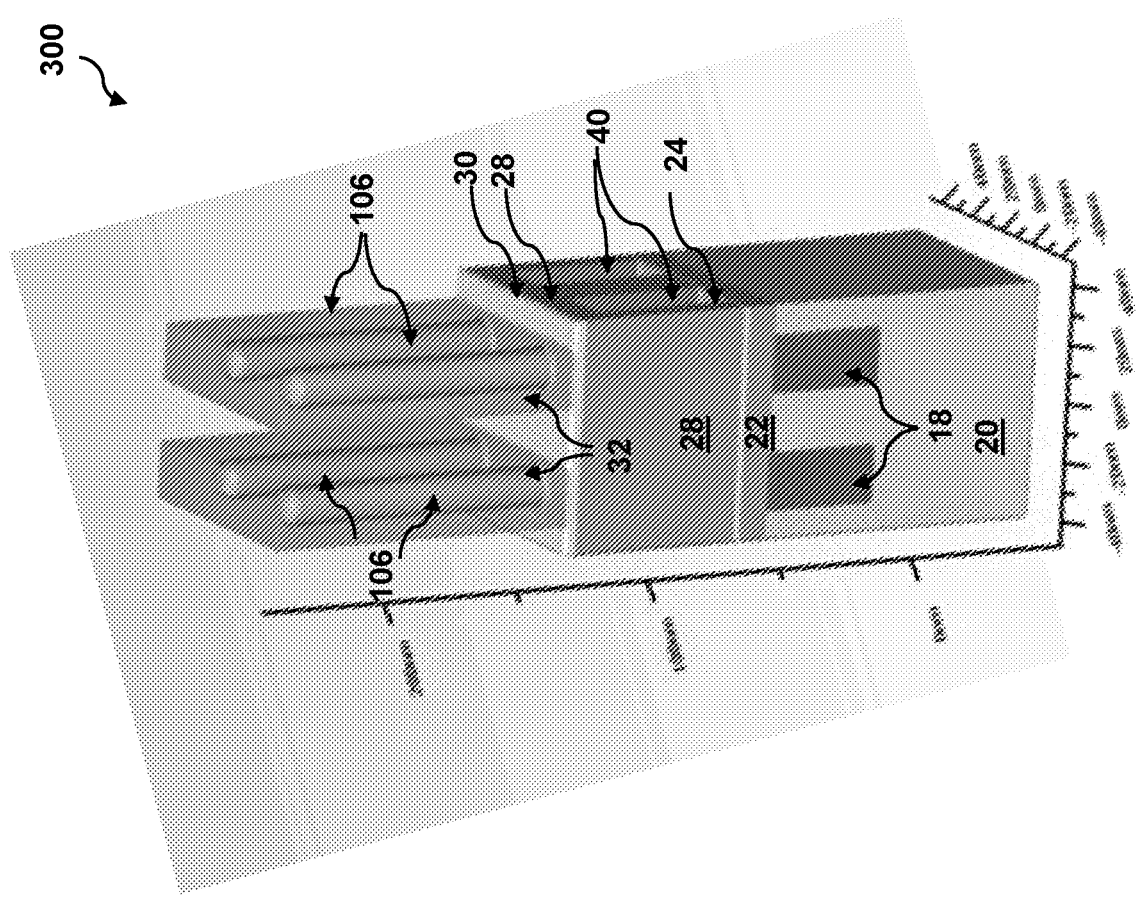
FIG. 24 is three-dimensional perspective view of memory unit cell.

As discussed above in FIGS. 17A and 17B, a memory cell (e.g., a memory cell 107 or memory cell 109) may form a portion of a memory cell unit. FIG. 24 is a three-dimensional (3D) perspective illustration that show the formation of a memory cell unit (e.g., memory unit cell 300) containing four (4) memory cells (e.g., memory cells 107). While 4 memory cell units are described as being formed, one skilled in the art will realize that a memory unit cell may include any number of memory cells or memory cell units.

As illustrated in FIG. 24, the memory unit cell 300 may include memory cells 107 that are arranged in an array, in which the nanowire structures 106 extend in the y-direction. In the memory unit cell 300, the bit lines 18 and the word lines 40 may be formed such that they extend in directions perpendicular to one another, e.g., the bit lines 18 extending in the x-direction and the word lines 40 extending in the z-direction. A bit line 18 may couple the drain regions 23 of memory cells 107 that are arranged along the bit line 18 in the x-direction. The bit lines 18 may be formed within the ILD layer 20, thereby electrically isolating adjacent bit lines 18.

A word line 40 may couple the gate structure 26 (not shown in FIG. 24) of memory cells 107 that are arranged along the word line 40 in the z-direction. To isolate adjacent word lines 40, the first spacer 22, the first dielectric layer 24 and/or the second spacer 28 may be formed under and over the word lines, respectively, and to extend between the word lines 40, thereby electrically isolating adjacent word lines 40. The second conductors 32 may be formed as rectangular plates that are arranged perpendicular to the word lines 40 (and parallel to the bit lines 18) extending in the x-direction. While FIG. 24 illustrates the second conductors 32 of the capacitive devices 104 (not labelled in FIG. 24) of the memory cells 107 as rectangular plates, one skilled in the art will realize that the second conductors 32 may be formed as a single plate coupling each of the memory cells 107. The second conductors 32 may couple the capacitive devices of the memory cells 107 that are arranged along rectangular plates in the x-direction. While not illustrated, an insulating material may be formed between the conductors 32 thereby electrically isolating adjacent conductors 32 from one another.

Figure 25:
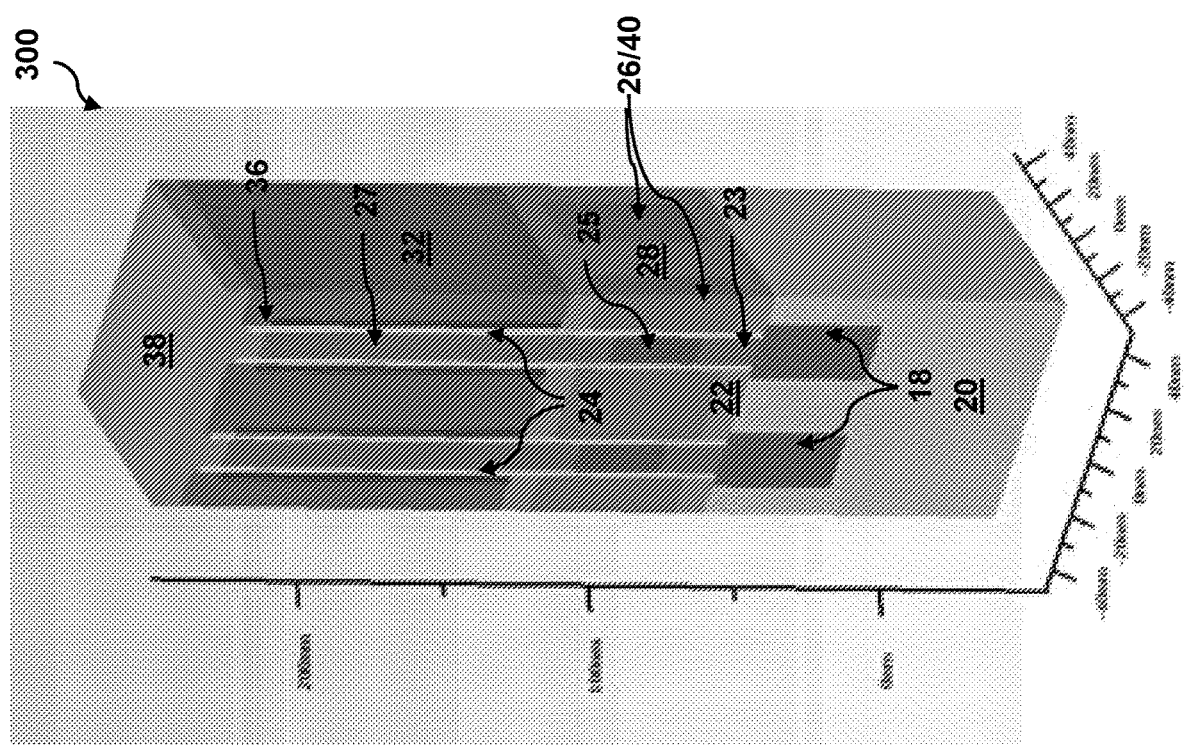
FIG. 25 is three-dimensional perspective view of another memory unit cell.

FIG. 25 is a three-dimensional (3D) perspective illustration that shows the formation of a memory cell unit (e.g., memory unit cell 300) containing four (4) memory cells (e.g., memory cells 109). While 4 memory cell units are described as being formed, one skilled in the art may recognize that a memory unit cell may include any number of memory cells or memory cell units.

As illustrated in FIG. 25, the memory unit cell 300 may include memory cells 109 that are arranged in an array, in which the nanowire structures 106 extend in the y-direction. In the memory unit cell 300, the bit lines 18 and the word lines 40 may be formed as lines perpendicular to one another, e.g., the bit lines 18 extending in the x-direction and the word lines 40 extending from a gate structure 26 in the z-direction. A bit line 18 may couple the drain regions 23 of multiple memory cells 109 that are arranged along the bit line 18 in the x-direction. The bit lines 18 may be formed with in the ILD layer 20, thereby electrically isolating adjacent bit lines 18.

A word line 40 may couple the gate structures 26 of memory cells 109 that are arranged along the word line 40 in the z-direction. To isolate adjacent word lines 40, the spacer oxide layer 22 or the second spacer 28 may be formed to extend between the word lines 40, thereby electrically isolating adjacent word lines 40 from one another and from other elements. The second conductors 32 may be formed as rectangular plates that are arranged perpendicular to the word lines 40 (and parallel to the bit lines 18). While FIG. 25 illustrates the second conductors 32 of the capacitive devices 104 of the memory cells 109 as rectangular plates, one skilled in the art will realize that the second conductors 32 may be formed as a single plate coupling each of the memory cells 109. The second conductors 32 may couple the capacitive devices of the memory cells 109 that are arranged along rectangular plates in the x-direction.

As discussed above with reference to FIGS. 18-23, the dielectric layer 24 may be formed by filling the nanowire cavity 36 with a dielectric material. An inner diameter cavity may be formed within the dielectric layer 24 that fills the nanowire cavity 36. Thus, the nanowire structure 106 may be formed by filling the inner nanowire cavities 36, sequentially, with the materials that form the nanowire structure 106, e.g., the drain region 23, the channel region 25, the source region 27, and the first conductor 14. In this example, the hard mask 34 may be formed between the conductors 32 thereby electrically isolating adjacent conductors 32.

Figure 26:
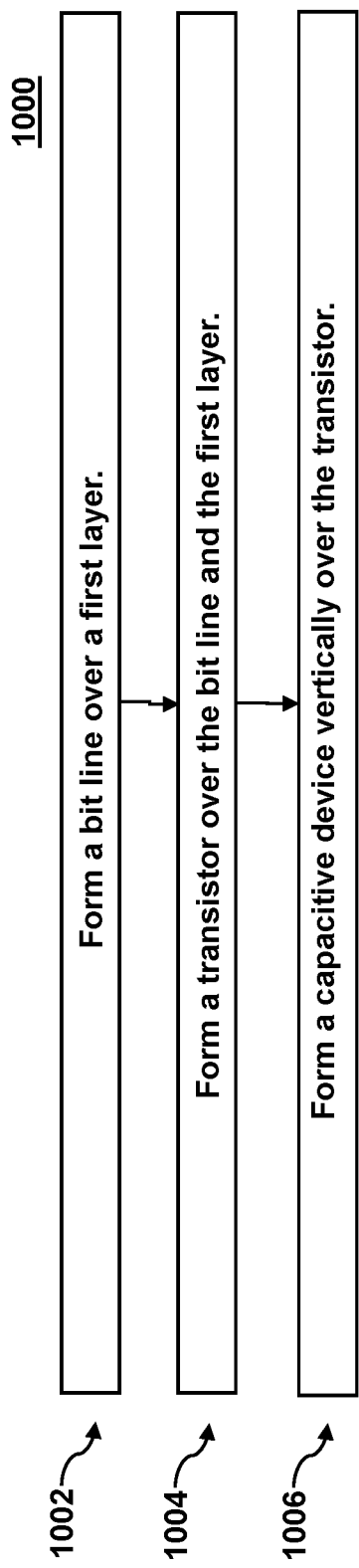
FIG. 26 is a process flow illustrating steps of a method for manufacture of memory cells in accordance with various embodiments of the present disclosure.

FIG. 26 is a process flow illustrating steps of a method 1000 for manufacture of memory cells, such as memory cells 107 and 109, in accordance with various embodiments of the present disclosure. Referring to step 1002, a bit line may be formed within a first layer. For example, as illustrated in FIG. 3, a bit line 18 may be formed over an ILD layer 20. Likewise, for example, as illustrated in FIGS. 24 and 25, the bit line 18 may be formed within the ILD layer 20, thereby electrically isolating adjacent bit lines 18.

Referring to step 1004, a transistor 105 may be formed over the bit line 18 and the first layer (e.g., ILD layer 20). In various embodiments disclosed herein, the transistor 105 may include a nanowire structure 106 forming a source region 23, a drain region 27, and a channel region 25 of the transistor 105. In the various embodiments, the nanowire structure 106 may extend vertically in a first direction (e.g., y-direction) from the bit line 18. For example, as illustrated in FIGS. 4, 5, and 7-11, a transistor 105 may be formed by "building up" a nanowire structure 106 in a first or vertical direction (e.g., y-direction). The nanowire structure 106 may be formed by depositing semiconductor layers (e.g., semiconductor layers 23L, 25L, 27L over the bit line 18) and then removing portions of the layers to form a drain region 23, a channel region 25, a source region 27. A dielectric layer (e.g., a first dielectric layer 24) and a gate (e.g., gate structure 26 may be formed).

Likewise, for example, as illustrated in FIGS. 18-23, a nanowire cavity 36 may be formed by removing portions of a spacer oxide layer 22, a gate layer 26L, the second spacer 28, a second conductor 32 using a hard mask 34. Then, a dielectric layer 24 may be formed by filling the nanowire cavity 36 with a dielectric material and removing portions of the dielectric material. Thus, the nanowire structure 106 may be formed by filling the inner nanowire cavities 36, sequentially, with the materials that form the nanowire structure 106, e.g., a drain region 23, a channel region 25, a source region 27 of a transistor 105.

Referring to step 1006, a capacitive device 104 may be formed vertically over the transistor. In embodiments, the capacitive device 104 may include a first conductor 14, a dielectric layer 30, and a second conductor 32. In embodiments, the first conductor 14 may be a vertical extension of the nanowire structure 106 in the first direction. For example, as illustrated in FIGS. 11-14, a capacitive device 104 may be formed over the transistor 105 in a first or vertical direction (e.g., y-direction). In the capacitive device 104, a first conductor 14 may be formed as a vertical extension of the nanowire structure 106. For example, as illustrated in FIG. 12, a first conductor material may be formed on the nanowire structure 106 and portions of the first conductor material may be removed (e.g., etched) to form the first conductor 14. In this example, as illustrated in FIG. 12, the first conductor 14 may be formed after forming the transistor 105. Likewise, in this example, the first conductor 14 may be formed when forming the drain region 23, the channel region 25, and the source region 27. For instance, prior to removing portions of the semiconductor layers (e.g., semiconductor layers 23L, 25L, 27L), the conductor material layer may be over a third semiconductor layer (e.g., semiconductor layer 27L), and portions of the conductor material layer are removed during removal of the semiconductor layers (e.g., semiconductor layers 23L, 25L, 27L) to form the first conductor 14. In another example, as illustrated in FIG. 23, a conductor material may be deposited in the nanowire cavity 36 to form the first conductor 14.

Figure 27:
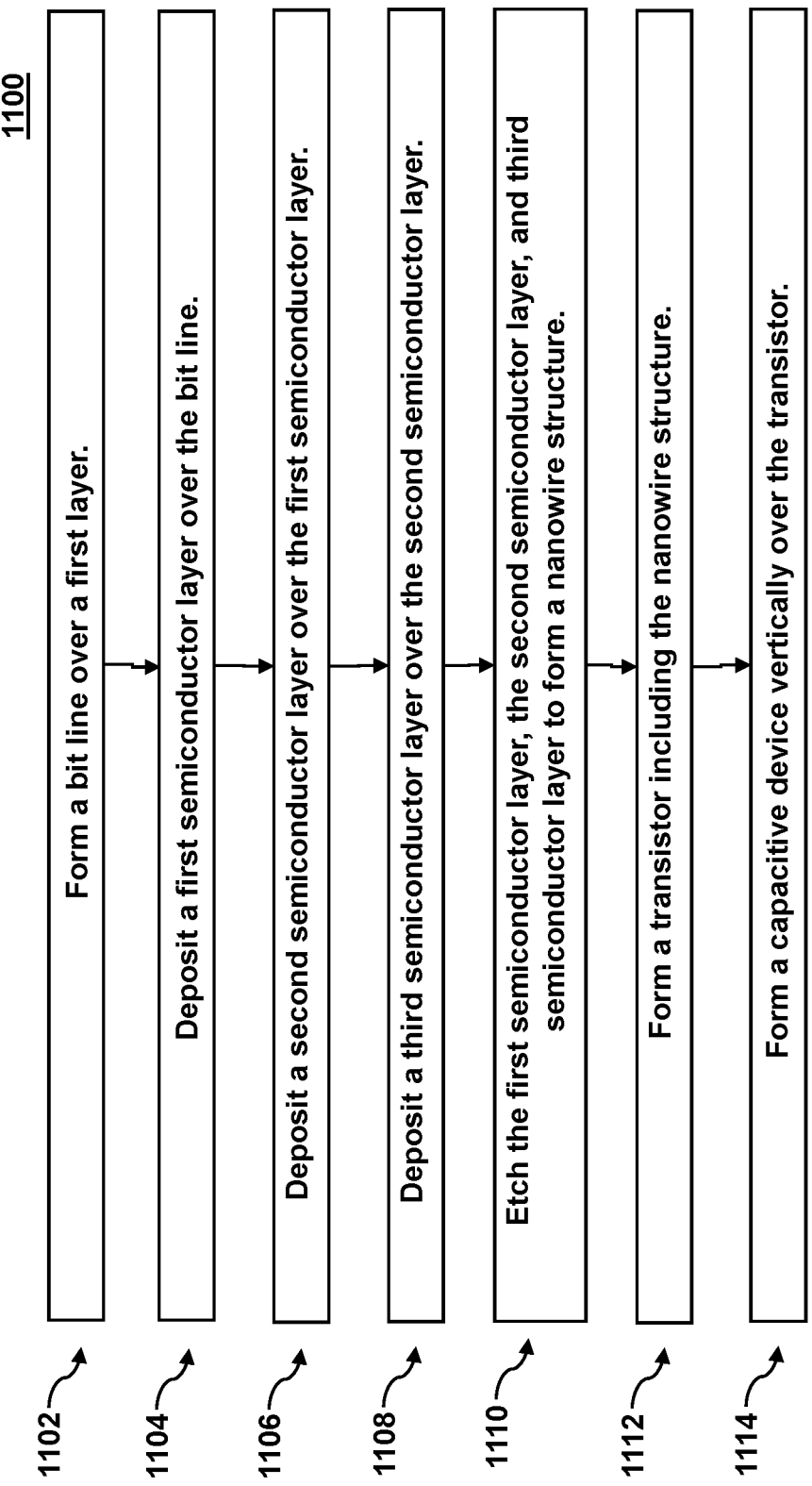
FIG. 27 is a process flow illustrating steps of another method for manufacture of memory cells in accordance with various embodiments of the present disclosure.

FIG. 27 is a process flow illustrating steps of a method 1100 for manufacture of a memory cell, such as memory cell 107, in accordance with various embodiments of the present disclosure. Referring to step 1102, a bit line may be formed within a first layer. For example, as illustrated in FIG. 3, a bit line 18 may be formed over an ILD layer 20. Likewise, for example, as illustrated in FIGS. 24 and 25, the bit line 18 may be formed within the ILD layer 20, thereby electrically isolating adjacent bit lines 18.

Referring to step 1104, a first semiconductor layer 23 may be deposited over the bit line 18. Referring to step 1106, a second semiconductor layer 25 may be deposited over the first semiconductor layer 23. Referring to step 1108, a third semiconductor layer 27 may be deposited over the second semiconductor layer 25. For example, as illustrated in FIG. 4, a transistor 105 may be formed by "building up" a nanowire structure 106 in a first or vertical direction (e.g., y-direction). The nanowire structure 106 may be formed by depositing the first, second, and third semiconductor layers (e.g., semiconductor layers 23L, 25L, 27L sequentially over the bit line 18).

Referring to step 1110, the first semiconductor layer 23, the second semiconductor layer 25, and the third semiconductor layer 27 may be etched to form a nanowire structure. For example, as illustrated in FIG. 5, portions of the first, second, and third semiconductor layers (e.g., semiconductor layers 23L, 25L, 27L) may be removed (e.g., etched) to form a drain region 23, a channel region 25, a source region 27. Referring to step 1112, a transistor 105 may be formed including the nanowire structure 106. For example, as illustrated in FIGS. 7-11, a transistor 105 may be formed that includes the nanowire structure 106. For instance, a dielectric layer (e.g., a first dielectric layer 24) and a gate (e.g., gate structure 26) may be formed.

Referring to step 1114, a capacitive device 104 may be formed vertically over the transistor 105. In embodiments, the capacitive device 104 may include a first conductor 14, a dielectric layer 30, and a second conductor 32. In embodiments, the first conductor 14 may be a vertical extension of the nanowire structure 106 in the first direction. For example, as illustrated in FIGS. 11-14, a capacitive device 104 may be formed over the transistor 105 in a first or vertical direction (e.g., y-direction). In the capacitive device 104, a first conductor 14 may be formed as a vertical extension of the nanowire structure 106. For example, as illustrated in FIG. 12, a first conductor material may be formed on the nanowire structure 106 and portions of the first conductor material are removed (e.g., etched) to form the first conductor 14. In this example, as illustrated in FIG. 12, the first conductor 14 may be formed after forming the transistor 105. Likewise, in this example, the first conductor 14 may be formed when forming the drain region 23, the channel region 25, and the source region 27. For instance, prior to removing portions of the semiconductor layers (e.g., semiconductor layers 23L, 25L, 27L), the conductor material layer may be over a third semiconductor layer (e.g., semiconductor layer 27L), and portions of the conductor material layer are removed during removal of the semiconductor layers (e.g., semiconductor layers 23L, 25L, 27L) to form the first conductor 14.

Figure 28:
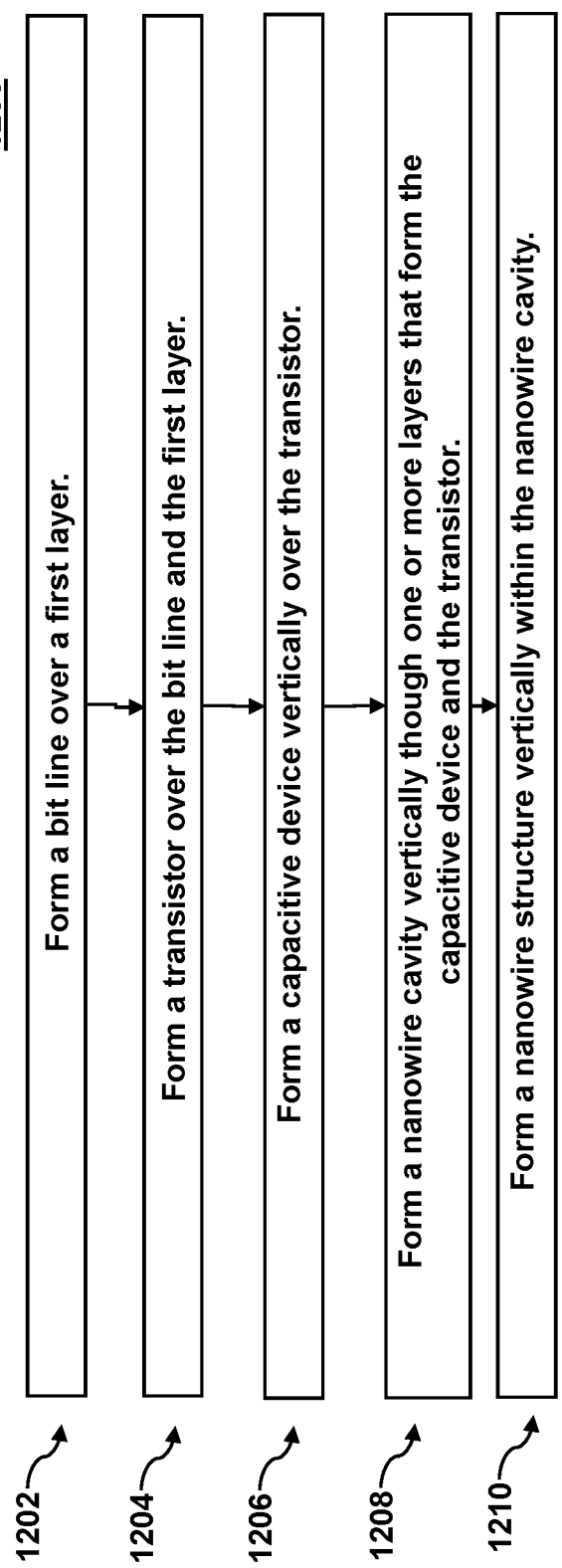
FIG. 28 is a process flow illustrating steps of another method for manufacture of memory cells in accordance with various embodiments of the present disclosure.

FIG. 28 is a process flow illustrating steps of a method 1200 for manufacture of a memory cell, such as memory cell 109, in accordance with various embodiments of the present disclosure. Referring to step 1202, a bit line may be formed within a first layer. For example, as illustrated in FIG. 3, a bit line 18 may be formed over an ILD layer 20. Likewise, for example, as illustrated in FIGS. 24 and 25, the bit line 18 may be formed with in the ILD layer 20, thereby electrically isolating adjacent bit lines 18.

Referring to step 1204, a transistor 105 may be formed over the bit line 18 and the first layer (e.g., ILD layer 20). Referring to step 1206, a capacitive device 104 may be formed vertically over the transistor 105. In embodiments, a nanowire structure 106 may be formed after the formation of the other components of a transistor (e.g., transistor 105) and a capacitive device (e.g., capacitive device 104). For example, as illustrated in FIG. 18, a ILD layer 20, the bit line 18, a spacer oxide layer 22, a gate layer 26L, a second spacer 28, a second conductor 32 may be formed for a memory cell 109.

Referring to step 1208, a nanowire cavity 36 may be formed vertically through one or more layers that form the capacitive device and the transistor. For example, as illustrated in FIGS. 18-23, a nanowire cavity 36 may be formed by removing portions of a spacer oxide layer 22, a gate layer 26L, the second spacer 28, a second conductor 32 using a hard mask 34.

Referring to step 1210, a nanowire structure 106 may be formed vertically within the nanowire cavity 36. In embodiments, the transistor 105 may include a nanowire structure 106 forming a source region 23, a drain region 27, and a channel region 25 of the transistor. In various embodiments disclosed herein, the nanowire structure 106 extends vertically in a first direction from the bit line 18. In some embodiments, the capacitive device 104 may include a first conductor 14, a dielectric layer 30, and a second conductor 32. In some embodiments, the first conductor 14 may be a vertical extension of the nanowire structure 106 in the first direction. For example, as illustrated in FIGS. 18-23, a dielectric layer 24 may be formed by filling the nanowire cavity 36 with a dielectric material and removing portions of the dielectric material. The nanowire structure 106 may be formed by filling the inner nanowire cavities 36, sequentially in a first or vertical direction (y-direction), with the materials that form the nanowire structure 106, e.g., a drain region 23, a channel region 25, a source region 27 of a transistor 105. Additionally, a conductor material may be deposited in the nanowire cavity 36 to form the first conductor 14 as part of the nanowire structure 106.

Referring collectively to FIGS. 1-28 and according to various embodiments of the present disclosure, a memory cell 107, 109 may be provided that includes a transistor 105 extending vertically from a bit line 18 in a first direction (y-direction). The transistor 105 may include a drain region 23, a source region 27, and a channel region 25 disposed between the drain region 23 and the source region 27. The drain region 23, the source region 27 and the channel region 25 may be stacked vertically in the first direction (e.g., y-direction). The memory cell 107, 109 may also include a capacitive device 104 positioned vertically above the transistor 105 in the first direction. The capacitive device 104 includes a first conductor 14. The first conductor 14 may be formed as vertical extension, in the first direction, of the source region 27 or the drain region 23, thereby forming a nanowire structure 106. The capacitive device 104 also includes a second conductor 32, and a dielectric material 24, 30 formed between the first conductor 14 and the second conductor 32. The memory cell 107, 109 may also include a gate structure 26 positioned horizontally adjacent to the channel region 25 in a second direction (e.g., x-direction).

In an embodiment, the memory cell 107, 109 may also include a second transistor 105B positioned vertically above the capacitive device 104. The second transistor 105B may include a second source region 27B, a second drain region 23B, and a second channel region 25B disposed between the second source region 27B and the second drain region 23B. The second source region 27B or the second drain region 23B may be formed as a vertical extension, in first direction, of the first conductor 14 of the capacitive device 104.

In an embodiment, the gate structure 26 forms a portion of a word line 40 for the memory cell 107, 109.

In an embodiment, the source region 27, the drain region 23, and the channel region 25 may have a circular cross-sectional area in a plane (e.g., x-z plane) lying in the second direction.

In an embodiment, the channel region 25 may include Indium Gallium Zinc Oxide (IGZO), and the source region 27 and the drain region 23 may comprise Indium Tin Oxide (ITO).

In an embodiment, the source region 27, the drain region 23, and the channel region 25 may comprise a first material, the first material of the source region 27 and the drain region 23 may have a first composition or crystallinity, and the first material of the channel region 25 may have a second composition or crystallinity that differs from the first composition or crystallinity.

In an embodiment, the first material is Indium Gallium Zinc Oxide (IGZO).

In an embodiment, the channel region 25 may have a first cross-sectional area in a plane lying in the second direction (e.g., x-z plane), the source region 27 and the drain region 23 may have a second cross-sectional area in a plane lying in the second direction, and the first cross-sectional area may be less than the second cross-sectional area.

In an embodiment, the first conductor 14 of the capacitive device 104 may include a first material, and the source region 27 or the drain region 23 of the transistor 105 may include a second material.

In an embodiment, the first material and the second material may be the same material.

In an embodiment, the first conductor 14 of the capacitive device 104 may have a first cross-sectional area in a plane lying in the second direction (e.g., x-z plane), the source region 27, the drain region 23, and the channel region 25 of the transistor 105 may have a second cross-sectional area in a plane lying in the second direction, and the first cross-sectional area may be greater than the second cross-sectional area.

In an embodiment, the memory cell 107, 109 may further include a second dielectric layer 30 surrounding the channel region 25 between the channel region 25 and the gate structure 26.

In an embodiment, a dielectric layer of the capacitive device 104 may be a part of the second dielectric layer 30.

In an embodiment, the nanowire structure 106 may have a circular cross section.

In another embodiment, a memory unit cell 300 may include a plurality of memory cells 107, 109 positioned horizontally adjacent to one another in a first direction. Each of the plurality of memory cells 107, 109 may include a transistor 105 extending vertically from a bit line 18 in a second direction (e.g., y-direction). The transistor 105 may include a nanowire structure 106 extending vertically in the second direction and forming a source region 27, a drain region 23, and a channel region 25 disposed between the source region 27 and the drain region 23. Each of the plurality of memory cells 107, 109 may also include a capacitive device 104 positioned vertically above the transistor 105 in the second direction. The capacitive device 104 may include a first conductor 14, a second conductor 32, and a dielectric layer 30 formed between the first conductor 14 and the second conductor 32. The first conductor 14 may be a vertical extension, in the second direction (e.g., y-direction), of the nanowire structure 106. The memory unit cell 300 may also include a plurality of bit lines 18. Each of the plurality of bit lines 18 may be coupled to a first set of memory cells 107, 109 selected from the plurality of memory cells 107, 109. The memory unit cell 300 may also include a plurality of word lines 40. Each of the plurality of word lines 40 may be coupled to a second set of memory cells 107, 109 selected from the plurality of memory cells 107, 109.

In another embodiment, a method of forming a memory cell may include forming a bit line 18 over a first layer (e.g., ILD 20). The method may also include forming a transistor 105 over the bit line 18 and the first layer (e.g., ILD 20). The transistor 105 may include a nanowire 106 forming a source region 27, a drain region 23, and a channel region 25 of the transistor 105. The nanowire 106 may extend vertically in a first direction (e.g., y-direction) from the bit line 18. The method may also include forming a capacitive device 104 vertically over the transistor 105. The capacitive device 104 may include a first conductor 14, a dielectric layer 30, and a second conductor 32. The first conductor 14 may form a vertical extension of the nanowire 106 in the first direction.

In an embodiment, the method of forming the transistor 105 may include depositing a first semiconductor layer (e.g., semiconductor layer 23L) over the bit line 18, depositing a second semiconductor layer (e.g., semiconductor layer 25L) over the first semiconductor layer (e.g., semiconductor layer 23L), forming a third semiconductor layer (e.g., semiconductor layer 27L) over the second semiconductor layer (e.g., semiconductor layer 25L), and etching the first semiconductor layer (e.g., semiconductor layer 23L), second semiconductor layer (e.g., semiconductor layer 25L), and third semiconductor layer (e.g., semiconductor layer 27L) to form the nanowire structure 106.

In an embodiment, forming the capacitive device 104 may include depositing, prior to the etching, a conductor layer over the third semiconductor layer (e.g., semiconductor layer 27). During the etching, the conductor layer may be etched to form the first conductor 14.

In an embodiment, the method may further include forming a nanowire cavity 36 vertically through one or more layers that form the capacitive device 104 and the transistor 105, and forming the nanowire structure 106 vertically within the nanowire cavity 36.

In an embodiment, forming the nanowire structure may include depositing a series of semiconductor layers 23L, 25L, 27L within the nanowire cavity 36, where one of the semiconductor layers 23L, 25L, 27L comprises the first conductor 14.

The various embodiments described herein provide a memory cell that may be incorporated into a memory cell unit that improves the memory density by vertically stacking the access (or select) transistor 105 and capacitive device 104 that operates as the memory cell. Significant real estate on the substrate may be conserved by forming the access (select) transistor 105 in a vertical manner and vertically stacking the capacitive device 104 over the vertical transistor 105. In addition, oxide semiconductors may be employed to provide improved off current $I_{off}$. Thus, the memory cell 107, 109 may have improved read and write speed and energy characteristics. Moreover, the embodiment memory cells 107, 109 may be formed in a BEOL process at lower temperatures and may conserve space on the substrate even further. Thus, the overall density of the memory devices may be vastly improved.

As described herein, one skilled in the art will realize that examples of dimensions are approximate values and may vary by +/−5.0%, as required by manufacturing, fabrication, and design tolerances.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
    a transistor, comprising:
        a source region;
        a drain region;
        a channel region stacked between the source region and the drain region in a first direction; and
        a gate structure adjacent the channel region and extending lengthwise in a second direction perpendicular to the first direction; and
    a capacitive device, comprising:
        a first conductor extending above the transistor in the first direction;
        a dielectric material on the first conductor; and
        a second conductor on a side of the dielectric material opposite the first conductor, and extending lengthwise in a third direction perpendicular to the first direction and the second direction.

2. The memory cell of claim 1, further comprising:
    a second transistor on the capacitive device, wherein the second transistor comprises:
        a second source region;
        a second drain region; and
        a second channel region between the second source region and the second drain region, wherein the second source region or the second drain region is formed as a vertical extension, in a first direction, of the first conductor of the capacitive device.

3. The memory cell of claim 1, wherein the gate structure comprises a portion of a word line for the memory cell.

4. The memory cell of claim 1, wherein the source region, the drain region, and the channel region have a circular cross-sectional area in a plane lying in the second direction.

5. The memory cell of claim 1, wherein the channel region comprises Indium Gallium Zinc Oxide (IGZO), and
    wherein the source region and the drain region comprise Indium Tin Oxide (ITO).

6. The memory cell of claim 1, wherein the source region, the drain region, and the channel region comprise a first material,
    wherein the first material of the source region and the drain region has a first composition or crystallinity, and
    wherein the first material of the channel region has a second composition or crystallinity different than the first composition or crystallinity.

7. The memory cell of claim 6, wherein the first material comprises Indium Gallium Zinc Oxide (IGZO).

8. The memory cell of claim 1, wherein the channel region has a first cross-sectional area in a plane lying in the second direction,
    wherein the source region and the drain region have a second cross-sectional area in a plane lying in the second direction, and
    wherein the first cross-sectional area is less than the second cross-sectional area.

9. The memory cell of claim 1, wherein the first conductor of the capacitive device comprises a first material, and the source region or the drain region of the transistor comprises a second material.

10. The memory cell of claim 9, wherein the first material is substantially the same as the second material.

11. The memory cell of claim 9, wherein the first conductor of the capacitive device has a first cross-sectional area in a plane lying in the second direction,
    wherein the source region, the drain region, and the channel region of the transistor have a second cross-sectional area in a plane lying in the second direction, and
    wherein the first cross-sectional area is greater than the second cross-sectional area.

12. The memory cell of claim 1, further comprising:
    a dielectric layer surrounding the channel region between the channel region and the gate structure.

13. The memory cell of claim 12, wherein the dielectric material of the capacitive device comprises a portion of the dielectric layer.

14. The memory cell of claim 1, wherein the source region, the drain region and the channel region of the transistor and the first conductor of the capacitive device comprise a nanowire having a circular cross-section.

15. A memory device, comprising:
    a pair of bit lines;
    a plurality of transistors stacked between the pair of bit lines in a first direction, wherein each transistor of the plurality of transistors comprises:
        a source region;
        a drain region;
        a channel region stacked between the source region and the drain region in the first direction; and
        a gate structure adjacent the channel region and extending lengthwise in a second direction perpendicular to the first direction; and
    a capacitive device stacked between the plurality of transistors in the first direction, wherein the capacitive device comprises:
        a first conductor extending between the plurality of transistors in the first direction;

a dielectric material on the first conductor; and a second conductor on a side of the dielectric material opposite the first conductor, and extending lengthwise in a third direction perpendicular to the first direction and the second direction.

16. A method of forming a memory cell, comprising:

forming a source region, a drain region, and a channel region of a transistor, wherein the source region, the drain region and the channel region are stacked in a first direction;

forming a gate structure of the transistor adjacent the channel region and extending lengthwise in a second direction perpendicular to the first direction;

forming a first conductor of a capacitive device, wherein the first conductor is stacked on the transistor and extends above the transistor in the first direction;

forming a dielectric material of the capacitive device on the first conductor; and forming a second conductor of the capacitive device on a side of the dielectric material opposite the first conductor, wherein the second conductor extends lengthwise in a third direction perpendicular to the first direction and the second direction.

17. The method of claim 16, further comprising:

forming a bit line, wherein forming of the source region, the drain region and the channel region comprises forming the source region, drain region and channel region on the bit line.

18. The method of claim 17, wherein the forming of the source region, the drain region and the channel region comprises:

forming a first semiconductor layer on the bit line;

forming a second semiconductor layer on the first semiconductor layer;

forming a third semiconductor layer on the second semiconductor layer; and etching the first semiconductor layer, the second semiconductor layer and the third semiconductor layer.

19. The method of claim 16, further comprising:

after the forming of the source region, drain region and channel region, forming a dielectric layer on a sidewall of the source region, the drain region and the channel region, wherein the forming of the gate structure comprises forming the gate structure on the dielectric layer.

20. The method of claim 19, wherein the forming of the second conductor comprises forming the second conductor on the gate structure.

\* \* \* \* \*